US008999810B2

(12) United States Patent
Haba et al.

(10) Patent No.: US 8,999,810 B2
(45) Date of Patent: Apr. 7, 2015

(54) METHOD OF MAKING A STACKED MICROELECTRONIC PACKAGE

(71) Applicant: Tessera, Inc., San Jose, CA (US)

(72) Inventors: Belgacem Haba, Saratoga, CA (US); Vage Oganesian, Sunnyvale, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 13/970,028

(22) Filed: Aug. 19, 2013

(65) Prior Publication Data

US 2013/0330905 A1    Dec. 12, 2013

Related U.S. Application Data

(62) Division of application No. 11/704,713, filed on Feb. 9, 2007, now Pat. No. 8,513,789.

(60) Provisional application No. 60/850,850, filed on Oct. 10, 2006.

(51) Int. Cl.
*H01L 21/306* (2006.01)
*H01L 23/48* (2006.01)
(Continued)

(52) U.S. Cl.
CPC ........ *H01L 21/30604* (2013.01); *H01L 23/481* (2013.01); *H01L 24/24* (2013.01); *H01L 24/82* (2013.01); *H01L 24/94* (2013.01); *H01L 25/0657* (2013.01); *H01L 25/50* (2013.01); *H01L 24/83* (2013.01); *H01L 2224/16* (2013.01); *H01L 2224/24145* (2013.01);
(Continued)

(58) Field of Classification Search
USPC ........... 257/678, 686; 438/106, 109, 110, 113
See application file for complete search history.

(56) References Cited

U.S. PATENT DOCUMENTS

| 4,074,342 A | 2/1978 | Honn et al. |
| 4,500,905 A | 2/1985 | Shibata |

(Continued)

FOREIGN PATENT DOCUMENTS

| CN | 1723556 A | 1/2006 |
| CN | 1913149 A | 2/2007 |

(Continued)

OTHER PUBLICATIONS

Bang, U.S. Appl. No. 60/030,463, filed Sep. 6, 2002.
(Continued)

*Primary Examiner* — Caleb Henry
(74) *Attorney, Agent, or Firm* — Lerner, David, Littenberg, Krumholz & Mentlik, LLP

(57) ABSTRACT

A method of making a stacked microelectronic package by forming a microelectronic assembly by stacking a first subassembly including a plurality of microelectronic elements onto a second subassembly including a plurality of microelectronic elements, at least some of the plurality of microelectronic elements of said first subassembly and said second subassembly having traces that extend to respective edges of the microelectronic elements, then forming notches in the microelectronic assembly so as to expose the traces of at least some of the plurality of microelectronic elements, then forming leads at the side walls of the notches, the leads being in electrical communication with at least some of the traces and dicing the assembly into packages. Additional embodiments include methods for creating stacked packages using substrates and having additional traces that extend to both the top and bottom of the package.

15 Claims, 21 Drawing Sheets

(51) Int. Cl.
*H01L 23/00* (2006.01)
*H01L 25/065* (2006.01)
*H01L 25/00* (2006.01)

(52) U.S. Cl.
CPC .................. *H01L2224/83855* (2013.01); *H01L 2225/06551* (2013.01); *H01L 2225/06555* (2013.01); *H01L 2225/06586* (2013.01); *H01L 2225/06596* (2013.01); *H01L 2924/01029* (2013.01); *H01L 2924/01078* (2013.01); *H01L 2924/01082* (2013.01); *H01L 2924/14* (2013.01); *H01L 2224/9202* (2013.01); *H01L 2924/01005* (2013.01); *H01L 2924/01006* (2013.01); *H01L 2924/01033* (2013.01); *H01L 2924/014* (2013.01)

(56) References Cited

U.S. PATENT DOCUMENTS

| | | | |
|---|---|---|---|
| 4,765,864 | A | 8/1988 | Holland et al. |
| 4,842,699 | A | 6/1989 | Hua et al. |
| 4,897,708 | A | 1/1990 | Clements |
| 4,954,875 | A | 9/1990 | Clements |
| 5,322,816 | A | 6/1994 | Pinter |
| 5,343,071 | A | 8/1994 | Kazior et al. |
| 5,412,539 | A | 5/1995 | Elwell et al. |
| 5,424,245 | A | 6/1995 | Gurtler et al. |
| 5,426,072 | A | 6/1995 | Finnila |
| 5,466,634 | A | 11/1995 | Beilstein, Jr. et al. |
| 5,517,057 | A | 5/1996 | Beilstein, Jr. et al. |
| 5,563,084 | A | 10/1996 | Ramm et al. |
| 5,571,754 | A | 11/1996 | Bertin et al. |
| 5,604,673 | A | 2/1997 | Washburn et al. |
| 5,608,264 | A | 3/1997 | Gaul |
| 5,614,766 | A | 3/1997 | Takasu et al. |
| 5,618,752 | A | 4/1997 | Gaul |
| 5,646,067 | A | 7/1997 | Gaul |
| 5,656,553 | A | 8/1997 | Leas et al. |
| 5,661,087 | A | 8/1997 | Pedersen et al. |
| 5,682,062 | A | 10/1997 | Gaul |
| 5,696,030 | A | 12/1997 | Cronin |
| 5,716,759 | A | 2/1998 | Badehi |
| 5,766,984 | A | 6/1998 | Ramm et al. |
| 5,767,001 | A | 6/1998 | Bertagnolli et al. |
| 5,804,004 | A | 9/1998 | Tuckerman et al. |
| 5,814,889 | A | 9/1998 | Gaul |
| 5,817,530 | A | 10/1998 | Ball |
| 5,880,010 | A | 3/1999 | Davidson |
| 5,915,167 | A | 6/1999 | Leedy |
| 5,946,545 | A | 8/1999 | Bertin et al. |
| 5,973,386 | A | 10/1999 | Horikawa |
| 6,002,167 | A | 12/1999 | Hatano et al. |
| 6,022,758 | A | 2/2000 | Badehi |
| 6,031,274 | A | 2/2000 | Muramatsu et al. |
| 6,040,235 | A | 3/2000 | Badehi |
| 6,103,552 | A | 8/2000 | Lin |
| 6,130,823 | A | 10/2000 | Lauder et al. |
| 6,133,640 | A | 10/2000 | Leedy |
| 6,177,707 | B1 | 1/2001 | Dekker et al. |
| 6,177,721 | B1 | 1/2001 | Suh et al. |
| 6,188,129 | B1 | 2/2001 | Paik et al. |
| 6,204,562 | B1 | 3/2001 | Ho et al. |
| 6,208,545 | B1 | 3/2001 | Leedy |
| 6,228,686 | B1 | 5/2001 | Smith et al. |
| 6,252,305 | B1 | 6/2001 | Lin et al. |
| 6,261,865 | B1 | 7/2001 | Akram |
| 6,277,669 | B1 | 8/2001 | Kung et al. |
| 6,316,287 | B1 | 11/2001 | Zandman et al. |
| 6,340,845 | B1 | 1/2002 | Oda |
| 6,344,401 | B1 | 2/2002 | Lam |
| 6,396,710 | B1 | 5/2002 | Iwami et al. |
| 6,472,247 | B1 | 10/2002 | Andoh et al. |
| 6,472,293 | B1 | 10/2002 | Suga |
| 6,486,546 | B2 | 11/2002 | Moden et al. |
| 6,492,201 | B1 | 12/2002 | Haba |
| 6,498,381 | B1 | 12/2002 | Halahan et al. |
| 6,498,387 | B1 | 12/2002 | Yang |
| 6,548,391 | B1 | 4/2003 | Ramm et al. |
| 6,551,857 | B2 | 4/2003 | Leedy |
| 6,562,653 | B1 | 5/2003 | Ma et al. |
| 6,563,224 | B2 | 5/2003 | Leedy |
| 6,582,991 | B1 | 6/2003 | Maeda et al. |
| 6,607,938 | B2 | 8/2003 | Kwon et al. |
| 6,607,941 | B2 | 8/2003 | Prabhu et al. |
| 6,608,377 | B2 | 8/2003 | Chang et al. |
| 6,611,052 | B2 | 8/2003 | Poo et al. |
| 6,621,155 | B1 | 9/2003 | Perino et al. |
| 6,624,505 | B2 | 9/2003 | Badehi |
| 6,632,706 | B1 | 10/2003 | Leedy |
| 6,646,289 | B1 | 11/2003 | Badehi |
| 6,656,827 | B1 | 12/2003 | Tsao et al. |
| 6,693,358 | B2 | 2/2004 | Yamada et al. |
| 6,717,254 | B2 | 4/2004 | Siniaguine |
| 6,727,576 | B2 | 4/2004 | Hedler et al. |
| 6,730,997 | B2 * | 5/2004 | Beyne et al. .................. 257/698 |
| 6,737,300 | B2 | 5/2004 | Ding et al. |
| 6,743,660 | B2 | 6/2004 | Lee et al. |
| 6,753,205 | B2 | 6/2004 | Halahan |
| 6,753,208 | B1 | 6/2004 | MacIntyre |
| 6,777,767 | B2 | 8/2004 | Badehi |
| 6,784,023 | B2 | 8/2004 | Ball |
| 6,806,559 | B2 | 10/2004 | Gann et al. |
| 6,828,175 | B2 | 12/2004 | Wood et al. |
| 6,844,241 | B2 | 1/2005 | Halahan et al. |
| 6,844,619 | B2 | 1/2005 | Tago |
| 6,864,172 | B2 | 3/2005 | Noma et al. |
| 6,867,123 | B2 | 3/2005 | Katagiri et al. |
| 6,870,249 | B2 | 3/2005 | Egawa |
| 6,878,608 | B2 | 4/2005 | Brofman et al. |
| 6,897,148 | B2 | 5/2005 | Halahan et al. |
| 6,958,285 | B2 | 10/2005 | Siniaguine |
| 6,972,480 | B2 | 12/2005 | Zilber et al. |
| 6,972,483 | B1 | 12/2005 | Song |
| 6,977,441 | B2 | 12/2005 | Hashimoto |
| 6,982,475 | B1 | 1/2006 | MacIntyre |
| 6,984,545 | B2 | 1/2006 | Grigg et al. |
| 6,984,885 | B1 | 1/2006 | Harada et al. |
| 7,001,825 | B2 | 2/2006 | Halahan et al. |
| 7,005,324 | B2 | 2/2006 | Imai |
| 7,034,401 | B2 | 4/2006 | Savastiouk et al. |
| 7,049,170 | B2 | 5/2006 | Savastiouk et al. |
| 7,060,601 | B2 | 6/2006 | Savastiouk et al. |
| 7,087,459 | B2 | 8/2006 | Koh |
| 7,115,986 | B2 | 10/2006 | Moon et al. |
| 7,138,295 | B2 | 11/2006 | Leedy |
| 7,160,753 | B2 | 1/2007 | Williams, Jr. |
| 7,186,586 | B2 | 3/2007 | Savastiouk et al. |
| 7,192,796 | B2 | 3/2007 | Zilber et al. |
| 7,193,239 | B2 | 3/2007 | Leedy |
| 7,196,418 | B2 | 3/2007 | Ohno et al. |
| 7,208,343 | B2 | 4/2007 | Song et al. |
| 7,208,345 | B2 | 4/2007 | Meyer et al. |
| 7,215,018 | B2 | 5/2007 | Vindasius et al. |
| 7,241,641 | B2 | 7/2007 | Savastiouk et al. |
| 7,241,675 | B2 | 7/2007 | Savastiouk et al. |
| 7,285,865 | B2 | 10/2007 | Kwon et al. |
| 7,312,521 | B2 | 12/2007 | Noma et al. |
| 7,394,152 | B2 | 7/2008 | Yu et al. |
| 7,408,249 | B2 | 8/2008 | Badihi |
| 7,474,004 | B2 | 1/2009 | Leedy |
| 7,479,398 | B2 | 1/2009 | Zilber et al. |
| 7,495,316 | B2 | 2/2009 | Kirby et al. |
| 7,498,661 | B2 | 3/2009 | Matsuo |
| 7,504,732 | B2 | 3/2009 | Leedy |
| 7,510,928 | B2 | 3/2009 | Savastiouk et al. |
| 7,521,360 | B2 | 4/2009 | Halahan et al. |
| 7,622,810 | B2 | 11/2009 | Takao |
| 7,662,670 | B2 * | 2/2010 | Noma et al. .................. 438/114 |
| 7,662,710 | B2 | 2/2010 | Shiv |
| 7,663,213 | B2 | 2/2010 | Yu et al. |
| 7,705,466 | B2 | 4/2010 | Leedy |
| 7,719,102 | B2 * | 5/2010 | Noma et al. .................. 257/697 |
| 7,759,166 | B2 | 7/2010 | Haba et al. |

(56) References Cited

U.S. PATENT DOCUMENTS

| | | |
|---|---|---|
| 7,829,438 B2 | 11/2010 | Haba et al. |
| 7,838,979 B2 | 11/2010 | Oh |
| 7,859,115 B2 | 12/2010 | Kim et al. |
| 7,884,459 B2 | 2/2011 | Yoshida et al. |
| 7,901,989 B2 | 3/2011 | Haba et al. |
| 7,919,875 B2 * | 4/2011 | Noma et al. ............ 257/783 |
| 7,944,015 B2 | 5/2011 | Kitagawa et al. |
| 7,952,195 B2 | 5/2011 | Haba |
| 7,969,007 B2 | 6/2011 | Noma et al. |
| 7,973,416 B2 | 7/2011 | Chauhan |
| 8,022,527 B2 | 9/2011 | Haba et al. |
| 8,043,895 B2 | 10/2011 | Haba et al. |
| 8,076,788 B2 | 12/2011 | Haba et al. |
| 8,357,999 B2 | 1/2013 | Robinson et al. |
| 8,461,672 B2 | 6/2013 | Haba et al. |
| 2001/0024839 A1 | 9/2001 | Lin |
| 2001/0048151 A1 | 12/2001 | Chun |
| 2002/0031864 A1 * | 3/2002 | Ball ............ 438/113 |
| 2002/0047199 A1 | 4/2002 | Ohuchi et al. |
| 2002/0074637 A1 | 6/2002 | McFarland |
| 2002/0109236 A1 | 8/2002 | Kim et al. |
| 2002/0113303 A1 | 8/2002 | Murayama |
| 2002/0127775 A1 | 9/2002 | Haba et al. |
| 2002/0132465 A1 | 9/2002 | Leedy |
| 2002/0171145 A1 | 11/2002 | Higuchi et al. |
| 2003/0006494 A1 | 1/2003 | Lee et al. |
| 2003/0017647 A1 | 1/2003 | Kwon et al. |
| 2003/0060034 A1 * | 3/2003 | Beyne et al. ............ 438/618 |
| 2003/0094683 A1 | 5/2003 | Poo et al. |
| 2003/0096454 A1 | 5/2003 | Poo et al. |
| 2003/0134453 A1 * | 7/2003 | Prabhu et al. ............ 438/113 |
| 2003/0173608 A1 | 9/2003 | Leedy |
| 2003/0209772 A1 | 11/2003 | Prabhu |
| 2003/0218191 A1 | 11/2003 | Nordal et al. |
| 2003/0230805 A1 * | 12/2003 | Noma et al. ............ 257/737 |
| 2003/0233704 A1 | 12/2003 | Castellote |
| 2004/0014255 A1 | 1/2004 | Grigg et al. |
| 2004/0016942 A1 | 1/2004 | Miyazawa et al. |
| 2004/0023438 A1 * | 2/2004 | Egawa et al. ............ 438/113 |
| 2004/0048419 A1 * | 3/2004 | Kitamura et al. ............ 438/113 |
| 2004/0070063 A1 | 4/2004 | Leedy |
| 2004/0082114 A1 | 4/2004 | Horng |
| 2004/0104454 A1 | 6/2004 | Takaoka et al. |
| 2004/0142509 A1 | 7/2004 | Imai |
| 2004/0155326 A1 | 8/2004 | Kanbayashi |
| 2004/0155354 A1 | 8/2004 | Hanaoka et al. |
| 2004/0169278 A1 | 9/2004 | Kinsman |
| 2004/0221451 A1 | 11/2004 | Chia et al. |
| 2004/0222508 A1 | 11/2004 | Aoyagi |
| 2004/0245614 A1 | 12/2004 | Jobetto |
| 2004/0251525 A1 | 12/2004 | Zilber et al. |
| 2005/0003649 A1 | 1/2005 | Takao |
| 2005/0009236 A1 * | 1/2005 | Ball ............ 438/113 |
| 2005/0009302 A1 * | 1/2005 | Wakui et al. ............ 438/464 |
| 2005/0012225 A1 | 1/2005 | Choi et al. |
| 2005/0046002 A1 | 3/2005 | Lee et al. |
| 2005/0051883 A1 | 3/2005 | Fukazawa |
| 2005/0056903 A1 | 3/2005 | Yamamoto et al. |
| 2005/0067680 A1 | 3/2005 | Boon et al. |
| 2005/0073035 A1 | 4/2005 | Moxham |
| 2005/0095835 A1 | 5/2005 | Humpston et al. |
| 2005/0101056 A1 * | 5/2005 | Song et al. ............ 438/109 |
| 2005/0104179 A1 * | 5/2005 | Zilber et al. ............ 257/684 |
| 2005/0156330 A1 | 7/2005 | Harris |
| 2005/0205977 A1 * | 9/2005 | Zilber et al. ............ 257/678 |
| 2005/0260794 A1 | 11/2005 | Lo et al. |
| 2005/0263866 A1 | 12/2005 | Wan |
| 2005/0282374 A1 * | 12/2005 | Hwang et al. ............ 438/613 |
| 2005/0287783 A1 | 12/2005 | Kirby et al. |
| 2006/0006488 A1 | 1/2006 | Kanbe |
| 2006/0017161 A1 | 1/2006 | Chung et al. |
| 2006/0019468 A1 * | 1/2006 | Beatty et al. ............ 438/464 |
| 2006/0043556 A1 | 3/2006 | Su et al. |
| 2006/0043598 A1 | 3/2006 | Kirby et al. |
| 2006/0043601 A1 | 3/2006 | Pahl |
| 2006/0046348 A1 | 3/2006 | Kang |
| 2006/0046471 A1 | 3/2006 | Kirby et al. |
| 2006/0055050 A1 | 3/2006 | Numata et al. |
| 2006/0055061 A1 | 3/2006 | Hosokawa et al. |
| 2006/0068580 A1 | 3/2006 | Dotta |
| 2006/0076670 A1 | 4/2006 | Lim et al. |
| 2006/0079019 A1 | 4/2006 | Kim |
| 2006/0094165 A1 | 5/2006 | Hedler et al. |
| 2006/0115932 A1 | 6/2006 | Farnworth et al. |
| 2006/0121645 A1 * | 6/2006 | Ball ............ 438/109 |
| 2006/0138626 A1 | 6/2006 | Liew et al. |
| 2006/0175697 A1 | 8/2006 | Kurosawa et al. |
| 2006/0220234 A1 | 10/2006 | Honer et al. |
| 2006/0220262 A1 | 10/2006 | Meyer et al. |
| 2006/0249829 A1 | 11/2006 | Katagiri et al. |
| 2006/0258044 A1 | 11/2006 | Meyer et al. |
| 2006/0292866 A1 | 12/2006 | Borwick et al. |
| 2007/0007556 A1 | 1/2007 | Shibayama |
| 2007/0035001 A1 | 2/2007 | Kuhmann et al. |
| 2007/0037379 A1 | 2/2007 | Enquist et al. |
| 2007/0045803 A1 | 3/2007 | Ye et al. |
| 2007/0045862 A1 | 3/2007 | Corisis et al. |
| 2007/0052050 A1 | 3/2007 | Dierickx |
| 2007/0102802 A1 | 5/2007 | Kang et al. |
| 2007/0126085 A1 | 6/2007 | Kawano et al. |
| 2007/0132082 A1 | 6/2007 | Tang et al. |
| 2007/0148941 A1 | 6/2007 | Haba et al. |
| 2007/0158807 A1 | 7/2007 | Lu et al. |
| 2007/0181989 A1 | 8/2007 | Corisis et al. |
| 2007/0190747 A1 | 8/2007 | Humpston et al. |
| 2007/0249095 A1 | 10/2007 | Song et al. |
| 2007/0257350 A1 | 11/2007 | Lee et al. |
| 2008/0083976 A1 | 4/2008 | Haba et al. |
| 2008/0083977 A1 | 4/2008 | Haba et al. |
| 2008/0090333 A1 | 4/2008 | Haba et al. |
| 2008/0099900 A1 | 5/2008 | Oganesian et al. |
| 2008/0099907 A1 | 5/2008 | Oganesian et al. |
| 2008/0116544 A1 * | 5/2008 | Grinman et al. ............ 257/659 |
| 2008/0116545 A1 | 5/2008 | Grinman et al. |
| 2008/0122113 A1 | 5/2008 | Corisis et al. |
| 2008/0157327 A1 | 7/2008 | Yang |
| 2008/0166836 A1 | 7/2008 | Jobetto |
| 2008/0246136 A1 | 10/2008 | Haba et al. |
| 2008/0284041 A1 | 11/2008 | Jang et al. |
| 2008/0308921 A1 | 12/2008 | Kim |
| 2008/0315407 A1 | 12/2008 | Andrews, Jr. et al. |
| 2009/0009491 A1 | 1/2009 | Grivna |
| 2009/0032966 A1 | 2/2009 | Lee et al. |
| 2009/0039528 A1 | 2/2009 | Haba et al. |
| 2009/0065907 A1 | 3/2009 | Haba et al. |
| 2009/0067135 A1 | 3/2009 | Hirai |
| 2009/0067210 A1 | 3/2009 | Leedy |
| 2009/0121323 A1 | 5/2009 | Kwon et al. |
| 2009/0160065 A1 | 6/2009 | Haba et al. |
| 2009/0166840 A1 | 7/2009 | Kang et al. |
| 2009/0166846 A1 | 7/2009 | Pratt et al. |
| 2009/0174082 A1 | 7/2009 | Leedy |
| 2009/0175104 A1 | 7/2009 | Leedy |
| 2009/0212381 A1 | 8/2009 | Crisp et al. |
| 2009/0218700 A1 | 9/2009 | Leedy |
| 2009/0219742 A1 | 9/2009 | Leedy |
| 2009/0219743 A1 | 9/2009 | Leedy |
| 2009/0219744 A1 | 9/2009 | Leedy |
| 2009/0219772 A1 | 9/2009 | Leedy |
| 2009/0230501 A1 | 9/2009 | Leedy |
| 2009/0309235 A1 | 12/2009 | Suthiwongsunthorn et al. |
| 2009/0316378 A1 | 12/2009 | Haba et al. |
| 2010/0053407 A1 | 3/2010 | Crisp et al. |
| 2010/0065949 A1 | 3/2010 | Thies et al. |
| 2010/0164086 A1 | 7/2010 | Noma et al. |
| 2010/0200966 A1 | 8/2010 | Karnezos |
| 2010/0219523 A1 | 9/2010 | Chow et al. |
| 2010/0225006 A1 | 9/2010 | Haba et al. |
| 2010/0230795 A1 | 9/2010 | Kriman et al. |
| 2011/0006432 A1 * | 1/2011 | Haba et al. ............ 257/773 |
| 2011/0024890 A1 | 2/2011 | Yang et al. |
| 2011/0039370 A1 | 2/2011 | Gomyo et al. |
| 2011/0198722 A1 | 8/2011 | Suh |

(56) References Cited

U.S. PATENT DOCUMENTS

| | | | |
|---|---|---|---|
| 2011/0248410 A1 | 10/2011 | Avsian et al. | |
| 2012/0025364 A1* | 2/2012 | Hoshino et al. | 257/686 |
| 2014/0027931 A1* | 1/2014 | Avsian et al. | 257/777 |

FOREIGN PATENT DOCUMENTS

| | | | |
|---|---|---|---|
| DE | 19516487 | C1 | 7/1996 |
| DE | 102004039906 | A1 | 8/2005 |
| EP | 0926723 | A1 | 6/1999 |
| EP | 1041624 | A1 | 10/2000 |
| EP | 1482553 | A2 | 12/2004 |
| EP | 1519410 | A1 | 3/2005 |
| EP | 1619722 | A1 | 1/2006 |
| EP | 1653510 | A | 5/2006 |
| EP | 1686627 | A1 | 8/2006 |
| EP | 1 741 668 | A2 | 1/2007 |
| EP | 1801866 | A2 | 6/2007 |
| FR | 2704690 | A1 | 11/1994 |
| FR | 2879347 | A1 | 6/2006 |
| JP | 60160645 | A | 8/1985 |
| JP | 07-509104 | A | 10/1995 |
| JP | 08306724 | A | 11/1996 |
| JP | 09045848 | A | 2/1997 |
| JP | 2001015683 | A | 1/2001 |
| JP | 2001035995 | A | 2/2001 |
| JP | 2001156250 | A | 6/2001 |
| JP | 2001210782 | A | 8/2001 |
| JP | 2001217386 | A | 8/2001 |
| JP | 2002093944 | A | 3/2002 |
| JP | 2002-512436 | A | 4/2002 |
| JP | 2002217331 | A | 8/2002 |
| JP | 2003-037758 | A | 2/2003 |
| JP | 2003086762 | A | 3/2003 |
| JP | 2003163324 | A | 6/2003 |
| JP | 2003208655 | A | 7/2003 |
| JP | 2003243606 | A | 8/2003 |
| JP | 2004063569 | A | 2/2004 |
| JP | 2004080006 | A | 3/2004 |
| JP | 2004119473 | A | 4/2004 |
| JP | 2004153130 | A | 5/2004 |
| JP | 2004158536 | A | 6/2004 |
| JP | 2004342862 | A | 12/2004 |
| JP | 2005101067 | A | 4/2005 |
| JP | 2005303031 | A | 10/2005 |
| JP | 2007523482 | A | 8/2007 |
| JP | 2007243207 | A | 9/2007 |
| JP | 2007528120 | A | 10/2007 |
| JP | 04-158565 | B2 | 10/2008 |
| KR | 100201672 | B1 | 6/1999 |
| KR | 2006-0020822 | A | 3/2006 |
| KR | 20070048952 | A | 5/2007 |
| KR | 20090013417 | A | 2/2009 |
| KR | 20090047776 | A | 5/2009 |
| KR | 20090070420 | A | 7/2009 |
| KR | 20090079924 | A | 7/2009 |
| KR | 20100057025 | A | 5/2010 |
| TW | I289936 | | 4/2004 |
| WO | 9425987 | A1 | 11/1994 |
| WO | 9845130 | A1 | 10/1998 |
| WO | 9940624 | A1 | 8/1999 |
| WO | 2004/025727 | A1 | 3/2004 |
| WO | 2004055891 | A1 | 7/2004 |
| WO | 2004114397 | | 12/2004 |
| WO | 2005081315 | A2 | 9/2005 |
| WO | 2006027981 | A1 | 3/2006 |
| WO | 20070066409 | A1 | 6/2007 |
| WO | 2008045422 | A2 | 4/2008 |
| WO | 20090017758 | A2 | 2/2009 |
| WO | 20090017835 | A2 | 2/2009 |
| WO | 20090023462 | A1 | 2/2009 |

OTHER PUBLICATIONS

Chinese Office Action and Search Report for Application 200980122523 dated Aug. 20, 2012.
Chinese Office Action for Application No. 200880109094.9 dated Jun. 30, 2011.
Chinese Office Action for Application No. 200880110215.1 dated Apr. 19, 2013.
Communication from PCT/US2010/000777, dated Aug. 5, 2010.
International Search Report and Written Opinion from PCT/US2010/000777, dated Nov. 19, 2010.
International Search Report and Written Opinion, PCT/US08/09207, dated Jan. 16, 2009.
International Search Report and Written Opinion, PCT/US2008/009353 dated Feb. 10, 2009.
International Search Report and Written Opinion, PCT/US2008/009356, dated Feb. 19, 2009.
International Search Report and Written Opinion, PCT/US2008/010746, dated May 27, 2009.
International Search Report and Written Opnion, PCT/US2007/021552 dated May 29, 2008.
International Search Report, PCT/US07/26095, dated Jul. 7, 2008.
International Search Report, PCT/US2008/002659 dated Oct. 17, 2008.
International Search Report, PCT/US2009/003643, dated Aug. 28, 2009.
Japanese Office Action for Application No. 2010-519235 dated Nov. 13, 2012.
Japanese Office Action for Application No. 2011-514614 dated Sep. 13, 2013.
Japanese Office Action for JP2011-554055 dated Mar. 27, 2012.
Korean Office Action for Application No. 10-2011-7024111 dated Nov. 15, 2011.
Office Action from U.S. Appl. No. 11/704,713 mailed Apr. 10, 2012.
Office Action from U.S. Appl. No. 12/908,227 mailed Apr. 9, 2012.
Partial International Search Report, PCT/US2008/002659 dated Jul. 16, 2008.
Response to Office Action from U.S. Appl. No. 11/704,713 mailed Mar. 19, 2012.
Response to Office Action from U.S. Appl. No. 12/908,227 mailed Mar. 20, 2012.
Japanese Office Action for Application No. 2011-514614 dated Jan. 17, 2014.
Chinese Office Action for Application No. 201110370722.2 dated Dec. 3, 2013.
Korean Office Action for Application No. 10-2009-7009468 dated Oct. 31, 2013.

* cited by examiner

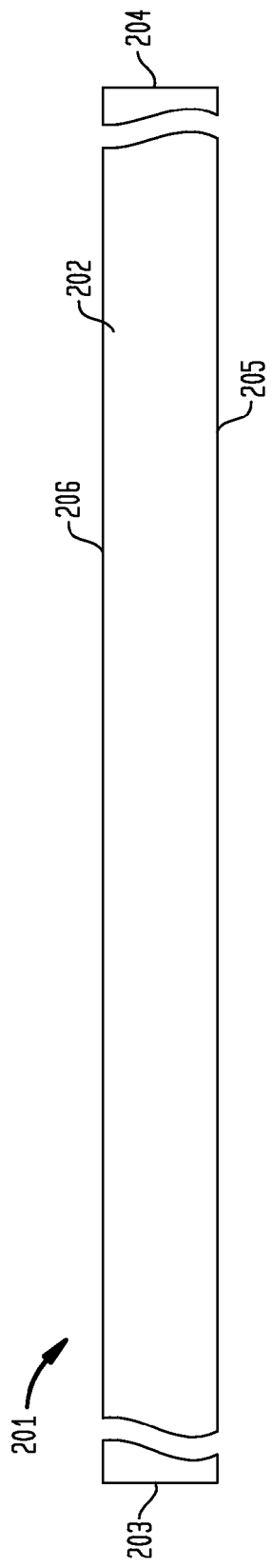
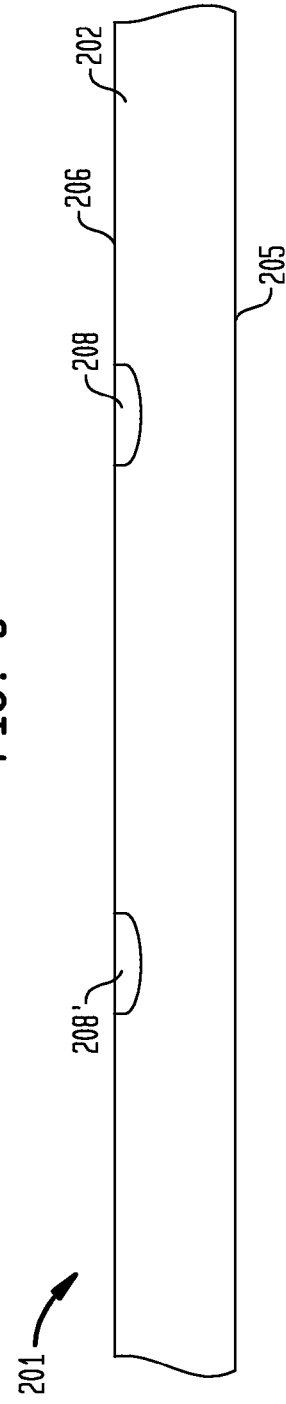

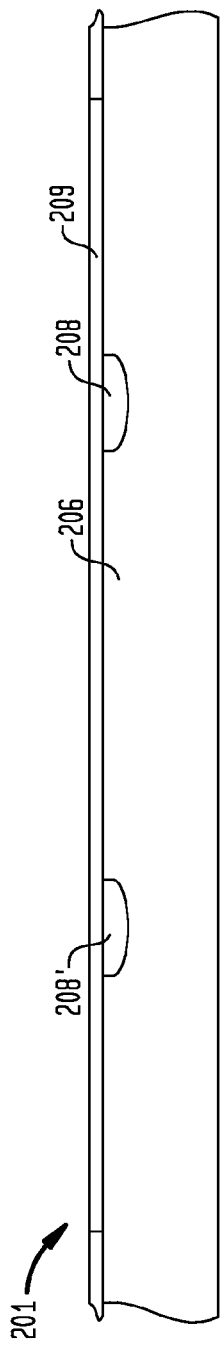
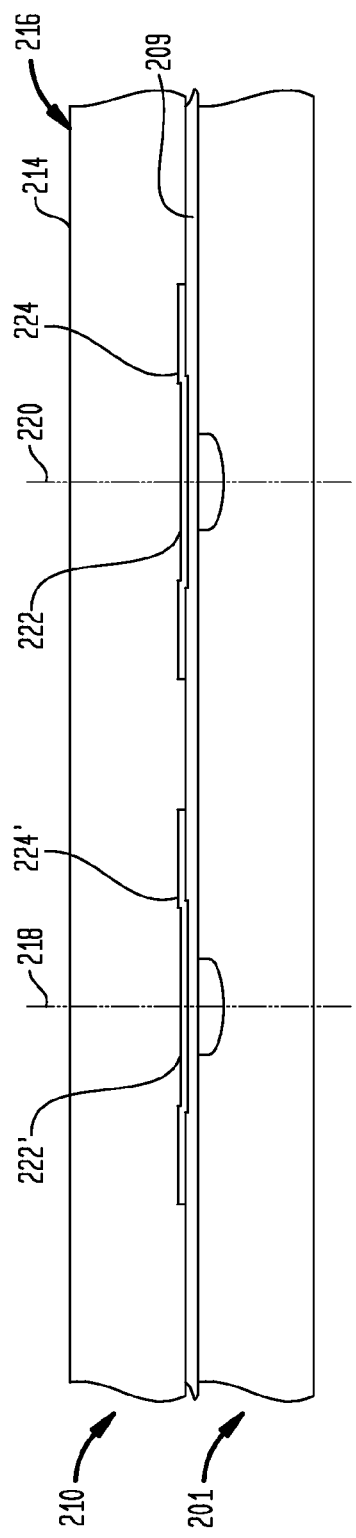

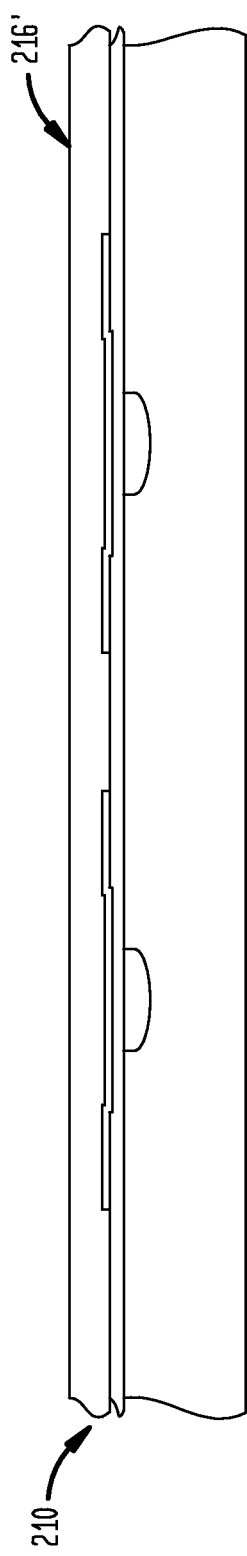
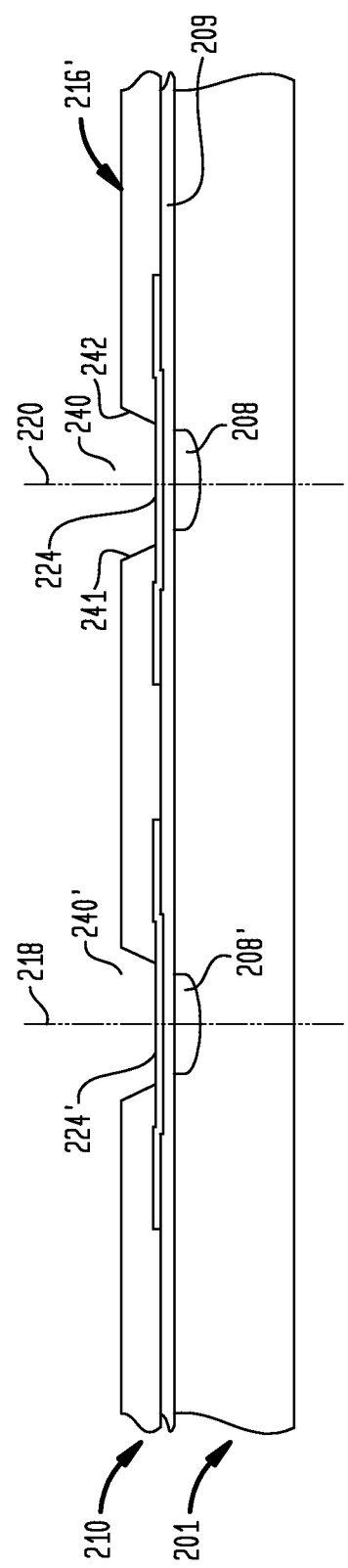

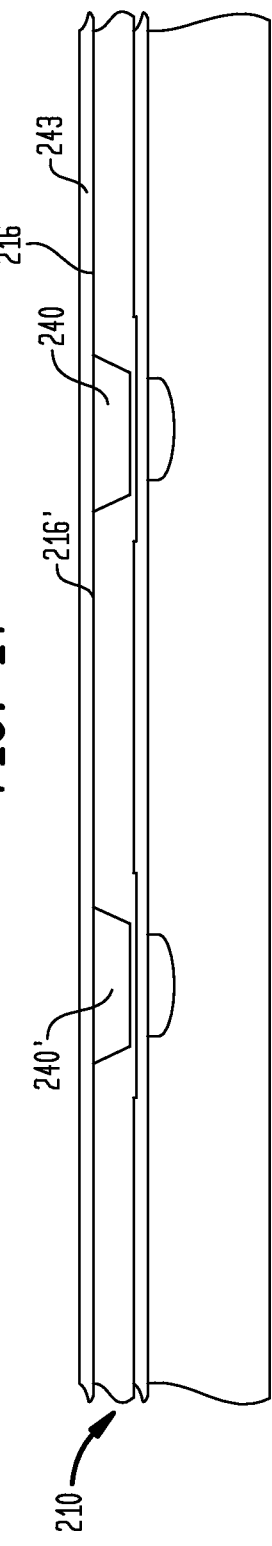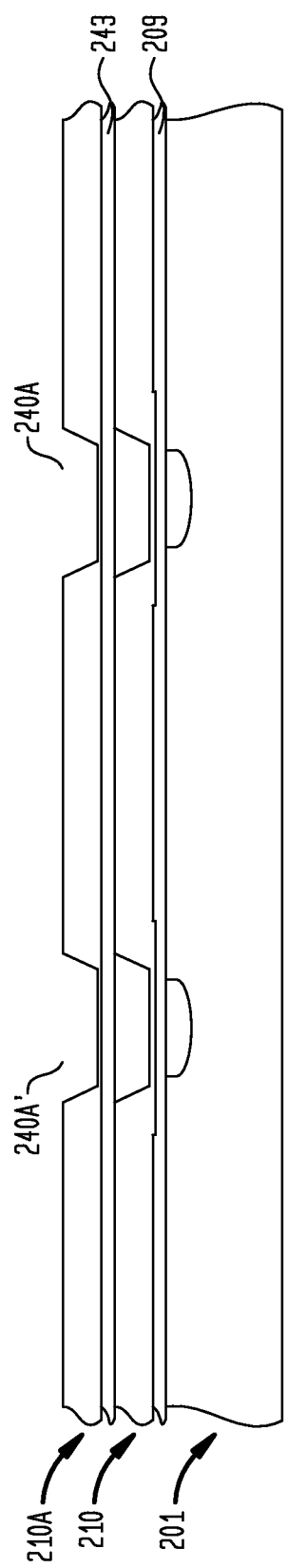

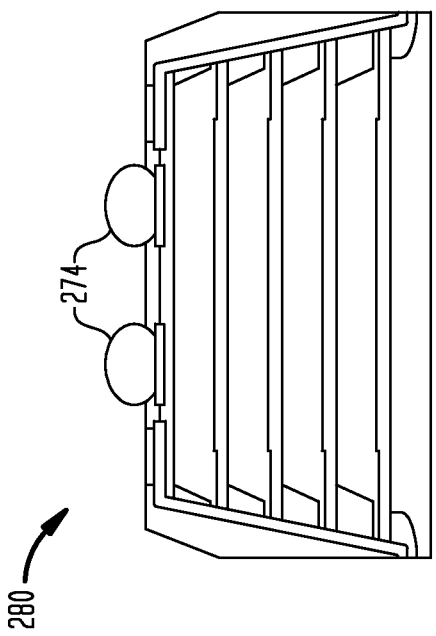

METHOD OF MAKING A STACKED MICROELECTRONIC PACKAGE

CROSS-REFERENCE TO RELATED APPLICATIONS

The present application is a divisional of U.S. patent application Ser. No. 11/704,713 filed Feb. 9, 2007, which claims the benefit of U.S. Provisional Patent Application No. 60/850, 850 filed Oct. 10, 2006, the disclosures of which are incorporated herein by reference.

BACKGROUND OF THE INVENTION

The present invention generally relates to stacked microelectronic packages and more particularly relates to stacked microelectronic packages fabricated at the wafer level and to methods of making such packages.

Semiconductor chips are flat bodies with contacts disposed on the front surface that are connected to the internal electrical circuitry of the chip itself. Semiconductor chips are typically packaged with substrates to form microelectronic packages having terminals that are electrically connected to the chip contacts. The package may then be connected to test equipment to determine whether the packaged device conforms to a desired performance standard. Once tested, the package may be connected to a larger circuit, e.g., a circuit in an electronic product such as a computer or a cell phone.

The substrate materials used for packaging semiconductor chips are selected for their compatibility with the processes used to form the packages. For example, during solder or other bonding operations, intense heat may be applied to the substrate. Accordingly, metal lead frames have been used as substrates. Laminate substrates have also been used to package microelectronic devices. Such substrates may include two to four alternating layers of fiberglass and epoxy, wherein successive fiberglass layers may be laid in traversing, e.g., orthogonal, directions. Optionally, heat resistive compounds such as bismaleimide triazine (BT) may be added to such laminate substrates.

Tapes have been used as substrates to provide thinner microelectronic packages. Such tapes are typically provided in the form of sheets or rolls of sheets. For example, single and double sided sheets of copper-on-polyimide are commonly used. Polyimide based films offer good thermal and chemical stability and a low dielectric constant, while copper having high tensile strength, ductility, and flexure has been advantageously used in both flexible circuit and chip scale packaging applications. However, such tapes are relatively expensive, particularly as compared to lead frames and laminate substrates.

Microelectronic packages also include wafer level packages, which provide a package for a semiconductor component that is fabricated while the die are still in a wafer form. The wafer is subject to a number of additional process steps to form the package structure and the wafer is then diced to free the individual die. Wafer level processing may provide a cost savings advantage. Furthermore, the package footprint can be identical to the die size, resulting in very efficient utilization of area on a printed circuit board (PCB) to which the die will eventually be attached. As a result of these features, die packaged in this manner are commonly referred to as wafer level chip scale package (WLCSP).

In order to save space certain conventional designs have stacked multiple microelectronic chips within a package. This allows the package to occupy a surface area on a substrate that is less than the total surface area of the chips in the stack. However, conventional stacked packages have disadvantages of complexity, cost, thickness and testability.

In spite of the above advances, there remains a need for improved wafer-scale packages and especially stacked wafer-scale packages that are reliable, thin, testable and that are economical to manufacture.

SUMMARY OF THE INVENTION

The present invention provides apparatus and methods for production of integrated circuit devices to create stacked microelectronic packages suitable for processing at a wafer level to produce integrated circuits of lower cost, smaller size, lower weight, enhanced electrical performance.

In accordance with a preferred embodiment of the present invention, a method for producing integrated circuit devices is provided including the steps of forming a microelectronic assembly by stacking a first subassembly including a plurality of microelectronic elements onto a second subassembly including a plurality of microelectronic elements, wherein the microelectronic elements have traces extending to their edges, then forming notches partway through the microelectronic assembly so as to expose the traces and subsequently forming leads at the sidewalls of the notches to provide electrical contacts on a planar surface of the assembly. Subsequently, the assembly is diced in order to form individual electronic elements in accordance with the preferred embodiment of the present invention. The step of forming notches extends only partway through the at least one subassembly allows continued wafer-level processing of the elements.

An additional embodiment of the present invention, the stacked assemblies incorporate a substrate to provide additional mechanical integrity to the assembly both during and after processing. The substrate may incorporate relief cavities that reduce stress concentrations during the notching process. It has been found that without such cavities, there is a propensity for the substrate to crack during the notching process.

In another aspect of the invention, adhesives are used to laminate the various layers of microelectronic sub-assemblies. Because of the stacking method, the traces of each subassembly are supported and retained by the adhesive of the immediate layer below and thereby prevented from being damaged.

In a still further preferred embodiment of the invention, each layer is initially notched to expose the traces and then filled with adhesive during the laminating process and this pattern of notching and filling is repeated for each of the subassembly layers. In this manner, when the notching occurs that will differentiate the microelectronic elements, the notching occurs entirely through the adhesive layers and the traces so that the traces are mechanically supported and insulated by the adhesive during the notching process.

It is a further aspect to the invention that the initial notching process is performed by non-mechanical means such as etching in order to preserve the mechanical integrity of the traces so that they remain intact.

It is an additional aspect of the present invention that stacked microelectronic packages comprising four subassembly layers and a substrate layer may have an overall package thickness of no more than 155 micrometers and that this thickness may be reduced by reducing the thickness of the substrate to a stacked thickness of no more than 125 micrometers.

In another embodiment of the invention, the stacked electronic packages have traces formed to both the top and bottom surfaces so that the stacked packages may be in turn stacked because the respective contacts on top and bottom layers of the packing can be aligned.

In a further preferred embodiment of the invention a method of making a stacked microelectronic package includes the steps of a) forming a microelectronic assembly by stacking a first subassembly including a plurality of microelectronic elements onto a substrate, stacking a second subassembly including a plurality of microelectronic elements onto the first subassembly, at least some of the plurality of microelectronic elements of the first subassembly and the second subassembly having traces that extend to respective edges of the microelectronic elements; b) forming notches in the microelectronic assembly so as to expose the traces of at least some of the plurality of microelectronic elements; and c) forming leads at the side walls of the notches, the leads being in electrical communication with at least some of the traces. In a further aspect of this embodiment the step of forming notches optionally includes forming initial notches in at least the first subassembly so as to expose the traces and filling the initial notches with adhesive so as to cover the traces and forming initial notches in at least the second subassembly so as to expose the traces and filling the initial notches with adhesive so as to cover the traces and forming the notches in the adhesive so as to expose the traces of at least some of the plurality of microelectronic elements.

An addition embodiment of the invention includes a method of making a microelectronic subassembly including the steps of a) forming initial notches in a first subassembly, including a plurality of microelectronic elements, the subassembly having traces that extend to respective edges of the microelectronic elements, so as to expose the traces; b) filling the initial notches with adhesive so as to cover the traces; and c) forming notches in the adhesive so as to expose the traces of at least some of the plurality of microelectronic elements.

An additional embodiment of the invention is a stacked microelectronic package including four subassemblies and a substrate stacked to each other, each subassembly including at least one microelectronic chip where the package has a stack thickness of no more than 155 micrometers. Such a package without a substrate has a stack thickness of no more than 125 micrometers.

An additional preferred embodiment of the invention is a method of making a stacked microelectronic package including the steps of a) forming a microelectronic assembly by stacking a first subassembly including a plurality of microelectronic elements onto the adhesive layer of a substrate, at least some of the plurality of microelectronic elements of the first subassembly having traces that extend to respective edges of the microelectronic elements; and then b) forming initial notches in the first subassembly so as to expose the traces and coating an adhesive layer on the first subassembly so as to fill the initial notches with adhesive and cover the traces; and then c) stacking a second subassembly including a plurality of microelectronic elements onto the adhesive layer of the first subassembly, at least some of the plurality of microelectronic elements of the first subassembly having traces that extend to respective edges of the microelectronic elements; and then d) forming initial notches in the second subassembly so as to expose the traces and coating an adhesive layer on the second subassembly so as to fill the initial notches with adhesive and cover said traces; and then e) forming notches in the adhesive layers so as to expose the traces of at least some of the plurality of microelectronic elements; and f) forming leads at the side walls of the notches, the leads being in electrical communication with at least some of the traces.

BRIEF DESCRIPTION OF THE DRAWINGS

FIG. 8 is a cross-sectional view of a substrate used in an additional embodiment of the invention using a substrate to form a stacked assembly;

FIG. 9 is a cross-sectional view of the substrate of FIG. 8 at a later stage during a method of manufacture according to one embodiment in the present invention;

FIG. 10 is a cross-sectional view of the substrate of FIG. 9 at a later stage during the method of manufacture according to one embodiment of the present invention;

FIG. 11 is a cross-sectional view of a stacked assembly wherein the subassembly of FIG. 7A-C is stacked on top of a substrate of FIG. 10 during a later stage of manufacture according to one embodiment of the present invention;

FIG. 12 is a cross-sectional view of the stacked assembly of FIG. 11 at a later stage during a method of manufacture according to one embodiment of the present invention;

FIG. 13 is a cross-sectional view of the stacked assembly of FIG. 12 at a later stage during a method of manufacture according to one embodiment of the present invention;

FIG. 14 is a cross-sectional view of the stacked assembly of FIG. 13 at a later stage during a method of manufacture according to one embodiment of the present invention;

FIG. 15 is a cross-sectional view of the stacked assembly of FIG. 14 at a later stage during a method of manufacture according to one embodiment of the present invention;

FIG. 23 is a cross-sectional view of an individual element according to FIG. 21 configured for bonding using a solder ball.

DETAILED DESCRIPTION

Reference is now made to FIGS. 1-4B, which illustrate a method and apparatus for stacking microelectronic components. As shown in FIGS. 1A-1B, a portion of a first wafer or subassembly 10 includes a plurality of microelectronic elements 12, each positioned side by side and adjacent to one another. The first wafer or subassembly 10 preferably includes numerous rows of microelectronic elements 12 aligned along an X-axis and a Y-axis. The microelectronic elements are formed integral with one another using conventional semiconductor process techniques. It should be apparent that the subassembly 10 may be a portion of a wafer. And the broken lines in the FIG. 1A illustrate that the subassembly may have additional elements attached thereto and may be in the shape of a circular wafer.

Figure 1A:
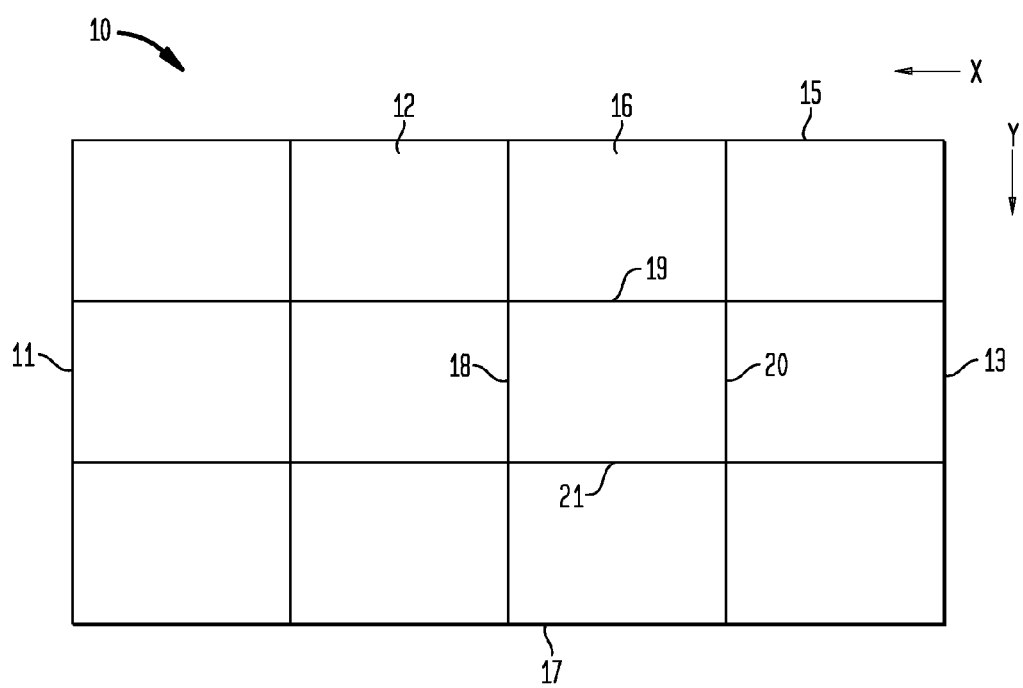
FIG. 1A is a top view of a subassembly according to one embodiment of the present invention.
Figure 1B:
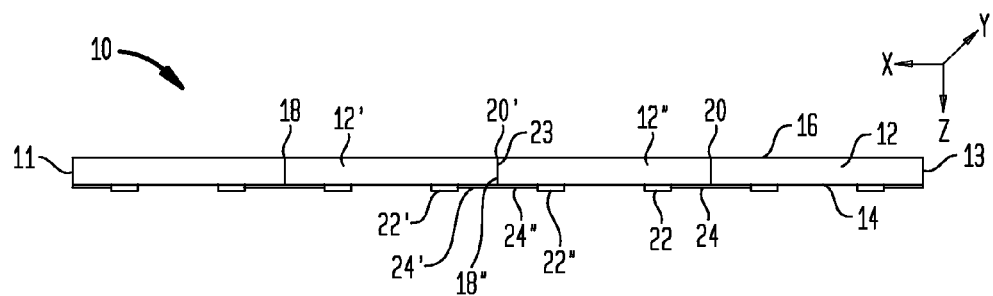
FIG. 1B is a cross-sectional view of the subassembly of FIG. 1A.

Each microelectronic element 12 includes a front face 14 and an oppositely-facing rear face 16. The microelectronic elements 12 also include first edges 18, second edges 20, third edges 19 and fourth edges 21, all of which extend from the front faces 14 to the rear faces 16 of the microelectronic elements 12. As shown in FIGS. 1A-1B, a first edge 18 of one microelectronic element 12 is attached to a second edge 20 of a second and adjacent microelectronic element 12. Similarly, a third edge 19 of one microelectronic element 12 is attached to a fourth edge 21 of an adjacent microelectronic element. Thus, the microelectronic elements 12 positioned within the middle of the first subassembly 10 are bordered by an adjacent microelectronic element 12 at all four edges, as shown in FIG. 1A. The microelectronic elements 12 positioned at a first end 11, a second end 13, a third end 15 or a fourth end 17 of the wafer have at least one edge unencumbered by an additional microelectronic element. Although the edges are depicted in the drawings for clarity of illustration, in practice the edges may not be visible. Rather, at this stage, the edges or strips where adjacent microelectronic elements 12 contact one another are saw lanes or strips where the wafer can be cut without damaging the individual microelectronic elements. For instance, as shown in FIG. 1B, second edge 20' of microelectronic element 12' abuts first edge 18" of microelectronic element 12" and forms a saw lane 23. Similarly, throughout the wafer 10, saw lanes 23 are located at positions where microelectronic elements 12 abut one another. The first wafer/subassembly 10 may include any number of microelectronic elements 12 including as little as two or as many as is desirable Each of the microelectronic elements 12 also includes a plurality of contacts 22 exposed at the respective front face 14 of the microelectronic element 12. Further, a trace 24 extends outwardly from each of the contacts 22 to a respective first, second, third or fourth edge 18, 20, 19, and 21 of the individual microelectronic element 12. For example, with reference to FIG. 1B, trace 24' extends outwardly from contact 22' towards the second edge 20' of microelectronic element 12'.

The trace 24' extends to and contacts trace 24", which extends outwardly from contact 22". Thus, traces 24' and 24" meet at the attachment point of microelectronic elements 12' and 12" and may actually form a single trace extending between contact 22' and contact 22". However, it is not required that the traces actually contact one another. Similar structures may be included for all adjacent microelectronic elements 12. Once again, contacts 22, which are positioned at the respective ends of the first subassembly 10 do not have traces 24 that extend to an adjacent contact on a different microelectronic element, but rather these traces 24 simply extend to a respective end of the first assembly 10.

Figure 2:
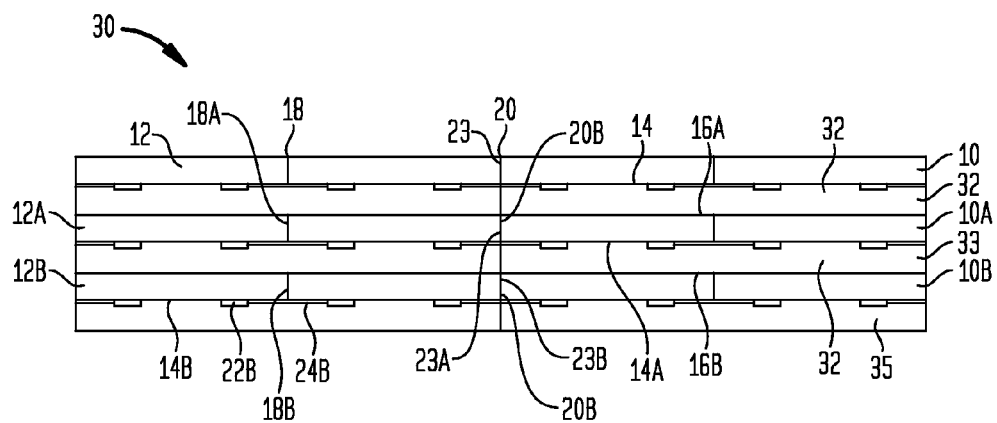
FIG. 2 is a cross-sectional view of a plurality of subassemblies attached to one another to form a stacked assembly.

As shown in FIG. 2, to create a stacked assembly 30, the first subassembly 10 is positioned over a second wafer/subassembly 10A and third wafer/subassembly 10B. The second subassembly and third subassembly 10A, 10B are similarly constructed to the first subassembly 10 and thus like elements will be given similar character references unless otherwise specified. The stacked assembly 30 of FIG. 2 includes three individual wafers/subassemblies stacked one upon another, but in alternate embodiments the stacked assembly 30 may include less or more wafers/subassemblies positioned on top of each other.

As shown in FIG. 2, the microelectronic elements 12 of the first subassembly 10 are aligned with the microelectronic elements 12A of the second subassembly 10A and the microelectronic elements 12B of the third subassembly 10B. Thus, the respective first, second, third and fourth edges of each of the microelectronic elements 12, 12A, 12B of the respective subassemblies 10, 10A, 10B are also aligned along longitudinal axes. Therefore, the respective saw lanes 23, 23A and 23B of each of the subassemblies are also aligned with one another. The stacked assembly 30 consists of a plurality of microelectronic elements 12, 12A, 12B, oriented and aligned in various rows and columns.

To attach the individual subassemblies 10, 10A, 10B to one another, an adhesive layer 32 is positioned between the front face 14 of the first subassembly 10 and the rear face 16A of the second subassembly 10A. Similarly, an adhesive layer 33 is also positioned between the front face 14A of the second subassembly 10A and the rear face 16B of the third subassembly 10B. An additional adhesive layer 35 may also be disposed on the front face 14B of the third subassembly 10B so as to protect the contacts 22B and traces 24B of the third subassembly 10B. The adhesive layers 32, 33, 35 may be formed from an epoxy or the like.

Once assembled, the adhesive layers 32, 33, 35 are allowed to cure such that the respective subassemblies 10, 10A, 10B are adhered to one another and form stacked assembly 30, which includes a plurality of microelectronic elements 12, 12A, 12B stacked adjacent to and upon one another.

Figure 3:
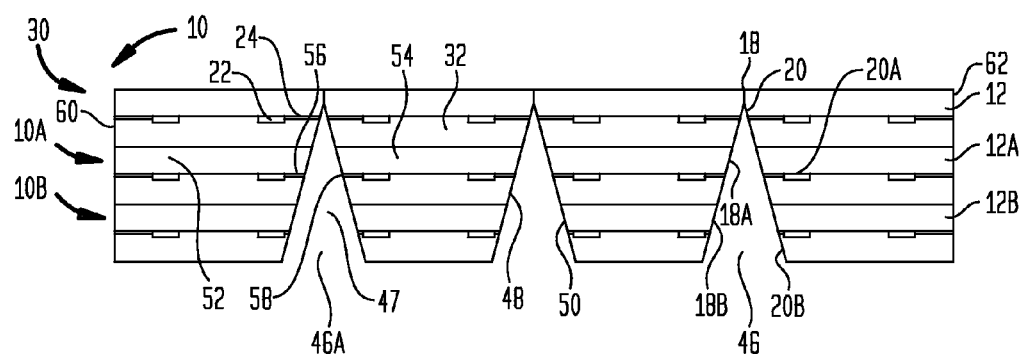
FIG. 3 is a cross-sectional view of the stacked assembly of FIG. 2 at a later stage during a method of manufacture according to one embodiment of the present invention.

With reference to FIG. 3, next, a plurality of notches 46 may be cut into the stacked assembly 30. The notches 46 are preferably formed using a mechanical cutting instrument not shown in the figures. Examples of such a mechanical cutting instrument can be found in U.S. Pat. Nos. 6,646,289 and 6,972,480, the disclosures of which are hereby incorporated by reference herein. The notches 46 are cut from the stacked assembly 30 at locations that are proximate the respective first edges 18, 18A, 18B, second edges 20, 20A and 20B, third edges 19, 19A, 19B and fourth edges 21, 21A, 21B of the respective microelectronic elements 12, 12A, 12B of the various subassemblies 10, 10A, 10B. The notches 46 are formed by cutting gaps 47 at the saw lanes 23, 23A and 23B. Since the saw lanes 23, 23A and 23B of each of the subassemblies 10, 10A 10B are aligned throughout the stacked assembly 30, a single cut may be used to form the gaps 47 between multiple subassemblies. Preferably, the notches 46 do not extend entirely through the stacked assembly 30. For instance, as shown in FIG. 3, the microelectronic elements 12 of the first subassembly 10 remain attached to each other as the various notches 46 do not extend entirely through the first subassembly. However, the notches 46 do extend far enough so as to intersect the traces 24 of the first subassembly 10 that extend between contacts 22 exposed at adjacent microelectronic elements 12. Similarly, the notches 46 dissect not only the various adhesive layers 32, 33, 35 interconnecting the subassemblies 10, 10A, 10B but also adjacent microelectronic elements 12A, 12B and respective traces 24, 24A, 24B of each subassembly. Although the notches 46 are illustrated having inclined side walls 48, 50, the side walls may also be straight.

For example, notch 46A of FIG. 3 intersects microelectronic element 52 and microelectronic element 54 of second subassembly 10A. The notch 46A intersects the two microelectronic elements 52, 54 such that the various edges of each of the microelectronic elements, which were previously attached to one another and formed saw lane 23 are separated by a gap 47. The gap 47 created by the notch 46A exposes the traces 56 and 58 adjacent the notch 46A. A similar structure is preferably included for all of the edges of the various microelectronic elements throughout the stacked assembly 30. The exposed traces 24, 24A, 24B form contact surfaces for each of the microelectronic elements 12, 12A, 12B. Of course, the first edge 60 and second edge 62 of the stacked assembly 30 does not have to be mechanically cut because the traces that extend toward these respective edges are already exposed. Although not shown in FIG. 3, the first and second edge 60, 62 may also be mechanically cut so as to create a more symmetrical configuration. Similarly, the edges of the stacked assembly 30 not shown in the figures also do not have to be mechanically cut although it may be desirable.

Figure 4A:
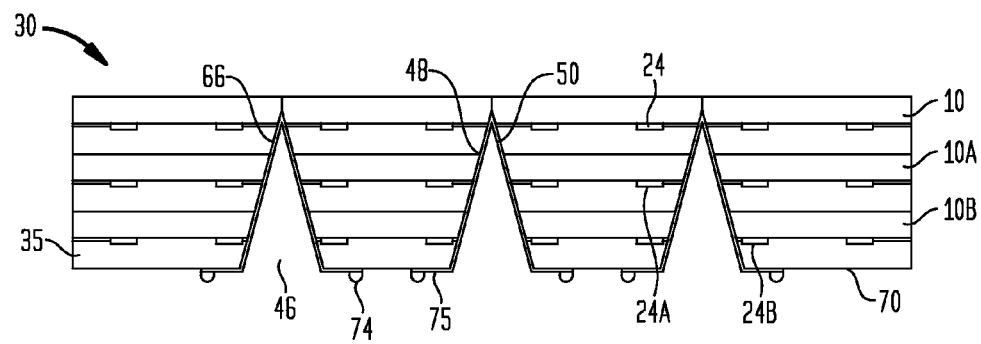
FIG. 4A is a cross-sectional view of the stacked assembly of FIG. 3 at a later stage of manufacture according to one embodiment of the present invention.
Figure 4B:
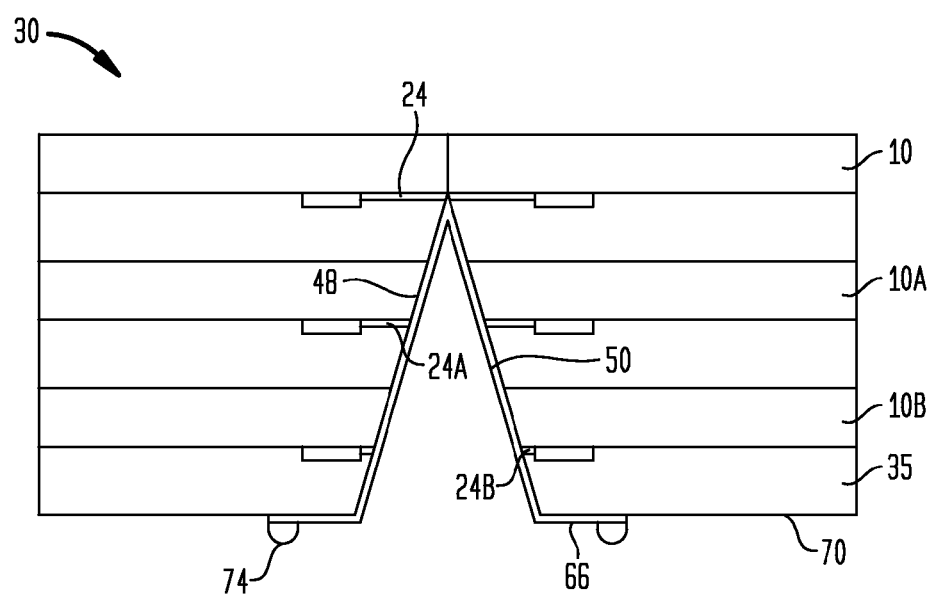
FIG. 4B is a cross-sectional blown-up view of a portion of the stacked assembly of FIG. 4A.

Once the various notches 46 have been created in the stacked assembly 30, leads 66 may be formed on the inclined side walls 48, 50 of notches 46. The inclined side walls 48, 50 extend through at least part of the various first, second and third subassemblies, 10, 10A, 10B, that were created as a result of the notches 46, as shown in FIGS. 4A and 4B. The leads 66 may be formed by any suitable metal deposition technique, for example, a process that includes sputtering, three-dimensional lithography and electroplating. Additional processes may also be employed. One such process is disclosed in U.S. Pat. No. 5,716,759, the disclosure of which is hereby incorporated by reference herein. The leads 66 extend within the various notches 46, and establish electrical contact with the traces 24, 24A and 24B. Preferably the leads 66 extend past the inclined side walls 48, 50 of notches 46 and are exposed at a first surface 70 of the adhesive layer 35 positioned below the third subassembly 10B. Therefore, the leads 66 include ends 75 remote from notches 46 and exposed on the surface of adhesive layer 35. Pads or solder bumps 74 may be formed at the ends 75 of the leads 66. Each lead 66 is in contact with three traces 24, 24A, 24B as a result of the traces being aligned and exposed at a respective inclined side wall 48 or 50. However, the leads 66 may be in electrical connection with only one or two of the traces 24, 24A, 24B at a respective inclined side wall 48 or 50. Such an orientation may be as a result of the positioning of the traces 24, 24A, 24B in different planes that are into and out of the page as viewed by the reader. For example, trace 24 illustrated in FIG. 4B may be offset from trace 24A so that trace 24 is closer to the reader if viewing in a three-dimensional orientation. The lead 66, which is aligned with trace 24, is also offset from trace 24A and not in contact with trace 24A. So although in a two-dimensional view, the traces 24, 24A may appear to be attached to lead 66 in FIG. 4B, only one may be actually attached to the lead.

Figure 5:
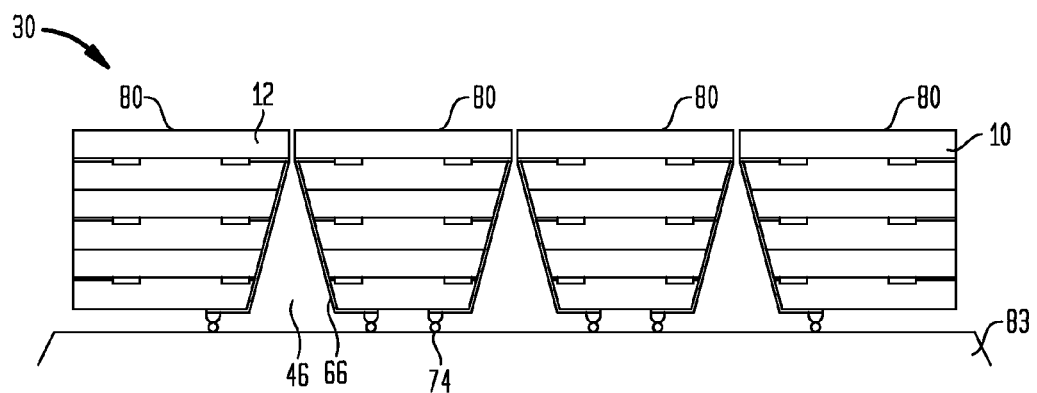
FIG. 5 is a cross-sectional view of the stacked assembly of FIG. 4A after the stacked assembly has been diced into individual units.

As shown in FIG. 5, after the notches 46 and various conductive elements including leads 66 are formed in the stacked assembly 30, individual packages 80 may be created by mechanically cutting through the wafer 10 of microelectronic elements 12 of the first subassembly 10. The microelectronic elements 12 of the first subassembly 10 are cut at locations that are proximate the notches 46 such that the notches 46 are allowed to extend entirely through the stacked assembly 30. Once the cuts have been performed, a plurality of stacked individual units 80 are created, with each stacked individual unit 80 containing a plurality of microelectronic elements stacked one upon another. The stacked individual units 80 may be electrically connected to a microelectronic element such as a substrate 83, circuit board or circuit panel via the solder bumps 74, as shown in FIG. 5.

The stacked individual unit 80 may be incorporated into microprocessors and RF units among other assemblies but may be particularly adaptable for Flash Memory and DRAM units.

Figure 6:
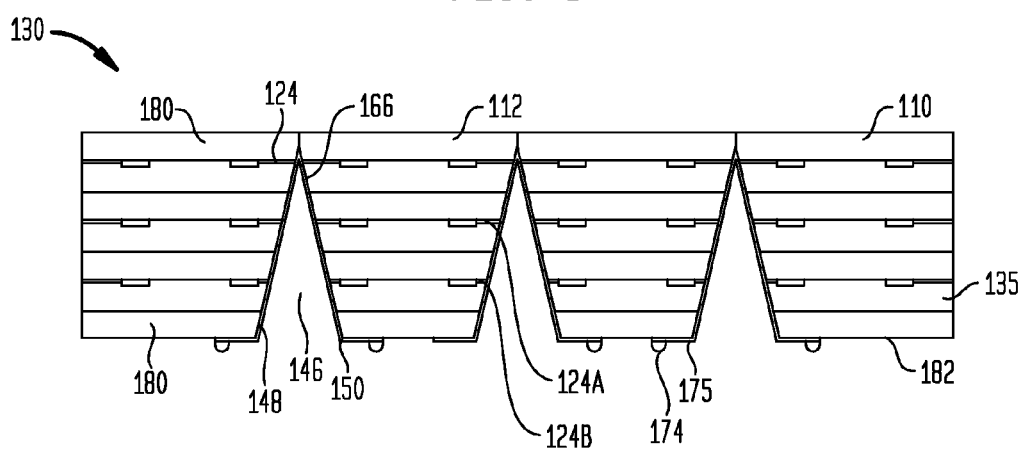
FIG. 6 is a cross-sectional view of an alternate embodiment of a stacked assembly according to an embodiment of the present invention.

In an alternate embodiment, as shown in FIG. 6, the stacked assembly 130 may include an additional substrate such as packaging layer 180. Stacked assembly 130 is similarly constructed to stacked assembly 30 discussed previously with regard to FIGS. 1-5 and includes most if not all of the same features discussed with regard to stacked assembly 30. In addition, stacked assembly 130 may be constructed following steps previously discussed with regard to stacked assembly 30. The only addition to stacked assembly 130 as compared to stacked assembly 30 is that during the manufacture of the stacked assembly 130 and preferably prior to creating notches in the stacked assembly 130, a packaging layer 180 is positioned below compliant layer 135. The packaging layer 180 is preferably formed of glass, silicon or a similar material. Once the packaging layer 180 has been positioned adjacent to the adhesive layer 135, a plurality of notches 146 are formed using a cutting instrument, as discussed with regard to stacked assembly 30. This exposes traces 124, 124A, 124B at the inclined side walls, 148, 150 of the notches 146. Further, a plurality of leads 166 may then be created on the inclined side walls 148, 150 and be placed in electrical contact with the various traces 124, 124A, 124B exposed at the inclined side walls, 148, 150 of the notches 146 as discussed with regard to stacked assembly 30. The various leads 166 preferably extend beyond the notches 146 and onto a front surface 182 of the packaging layer 180. Exposed ends 175 of the leads 166 may include pads or solder bumps 174. Although not shown in FIG. 6, once the various notches and conductive elements have been formed, the notches may be extended through the row of microelectronic elements 112 of the first subassembly 110 so as to create individual stacked units 180.

In an alternate embodiment, as shown in FIGS. 7-22, the stacked assembly 230 may include an additional substrate such as packaging layer 201. Stacked assembly 230 is similarly constructed to stacked assemblies 30 and 130 discussed previously with regard to FIGS. 1-7, except that the assembly starts with substrate layer 201, and includes many of the same features discussed with regard to stacked assembly 30 and 130. In addition, stacked assembly 230 may be constructed following steps previously discussed with regard to stacked assemblies 30 and 230.

Figure 7A:
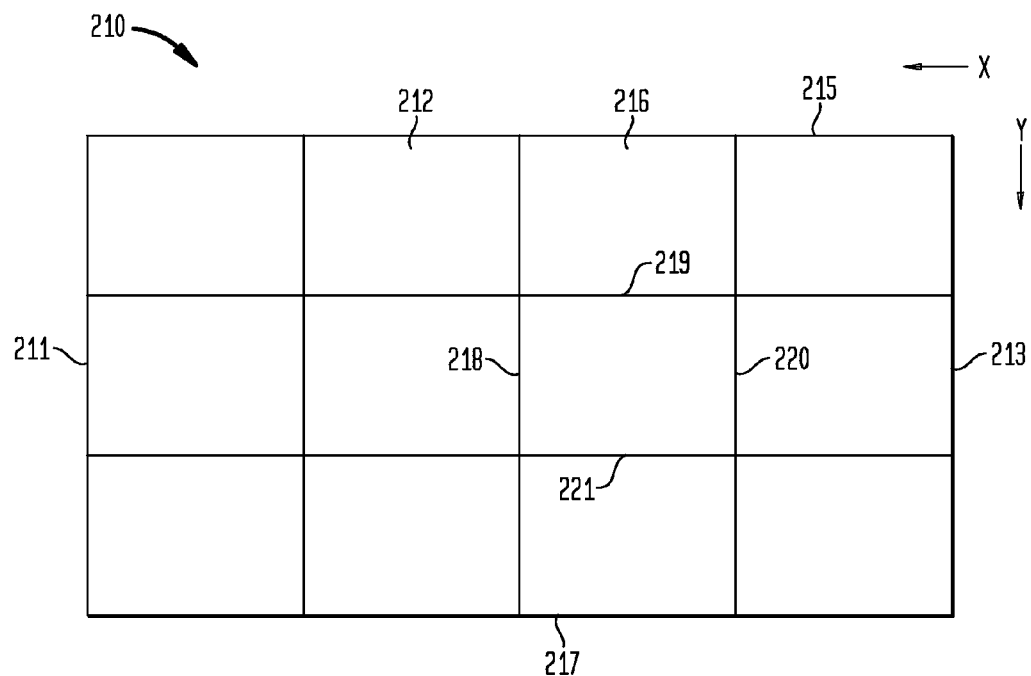
FIG. 7A is a top view of a subassembly according to one embodiment of the present invention.
Figure 7B:
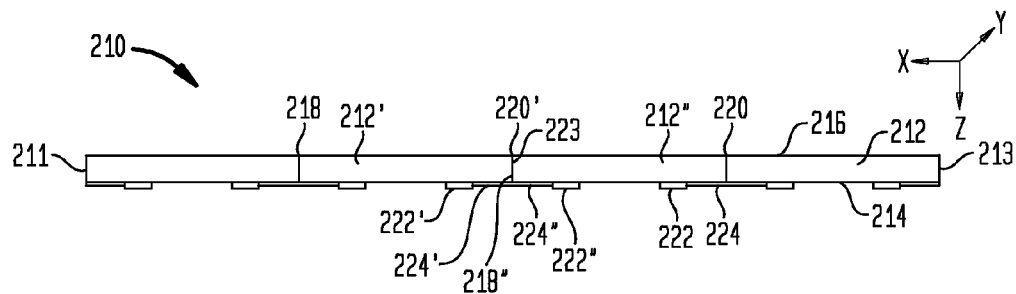
FIG. 7B is a cross-sectional view of the subassembly of FIG. 7A.
Figure 7C:
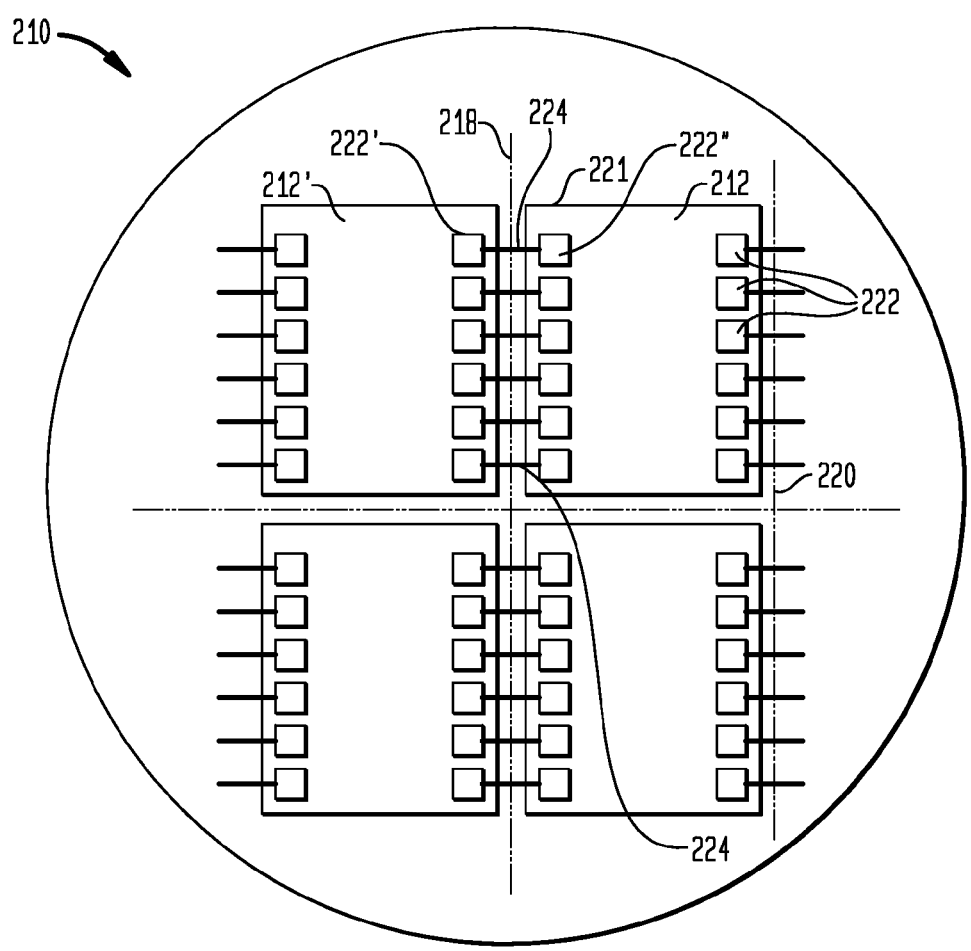
FIG. 7C is a bottom-view of the subassembly of FIG. 1A.

As shown in FIGS. 7A-7C, a portion of a first wafer or subassembly 210 includes a plurality of microelectronic elements 212, each positioned side by side and adjacent to one another. The first wafer or subassembly 210 preferably includes numerous rows of microelectronic elements 212 aligned along an X-axis and a Y-axis. The microelectronic elements are formed integral with one another using conventional semiconductor process techniques. It should be apparent that the subassembly 210 may be a portion of a wafer and that the various components are replicated repeatedly over the extent of the wafer. The FIGS. 7A-7C illustrate that the subassembly may have additional elements attached thereto and may be in the shape of a circular wafer.

Each microelectronic element 212 includes a front face 214 and an oppositely-facing rear face 216. The microelectronic elements 212 also include first edges 218, second edges 220, third edges 219 and fourth edges 221, all of which extend from the front faces 214 to the rear faces 216 of the microelectronic elements 212. As shown in FIGS. 7A-7C, a first edge 218 of one microelectronic element 212 is attached to a second edge 220 of a second and adjacent microelectronic element 212. Similarly, a third edge 219 of one microelectronic element 212 is attached to a fourth edge 221 of an adjacent microelectronic element. Thus, the microelectronic elements 212 positioned within the middle of the first subassembly 210 are bordered by an adjacent microelectronic element 212 at all four edges, as shown in FIG. 7A. The microelectronic elements 212 positioned at a first end 211, a second end 213, a third end 215 or a fourth end 217 of the wafer have at least one edge unencumbered by an additional microelectronic element. Although the edges are depicted in the drawings for clarity of illustration, in practice the edges may not be visible. Rather, at this stage the edges or strips where adjacent microelectronic elements 212 contact one another are saw lanes or strips where the wafer can be cut without damaging the individual microelectronic elements. For instance, as shown in FIG. 7B, second edge 220' of microelectronic element 212' abuts first edge 218" of microelectronic element 212" and forms a saw lane 223. Similarly, throughout the wafer 210, saw lanes 223 are located at positions where microelectronic elements 212 abut one another. The first wafer/subassembly 210 may include any number of microelectronic elements 212 including as little as two or as many as are desirable.

Each of the microelectronic elements 212 also includes a plurality of contacts 222 exposed at the respective front face 14 of the microelectronic element 212 best seen in FIG. 7C. Further, a trace 224 extends outwardly from each of the contacts 222 to respective edges 218, 220, 219, and 221 of the individual microelectronic element 212. The traces 224 may meet at the attachment point of microelectronic elements 212' and 212" and may actually form a single trace extending between contact 222' and contact 222". However, it is not required that the traces actually contact one another. Similar structures may be included for all adjacent microelectronic elements 212. Once again, contacts 222, which are positioned at the respective ends of the first subassembly 210 do not have traces 224 that extend to an adjacent contact on a different microelectronic element, but rather these traces 224 simply extend to a respective end of the first assembly 210.

In contrast to the embodiments discussed in connection with FIGS. 1-6, the embodiment of FIGS. 7-22 is shown constructed in stacked fashion from the substrate upwards. Consequently, many of the various components and processes are depicted in inverted fashion related to the earlier figures.

A packaging support wafer or layer 201 with substrate 202 for the stacked assembly of this embodiment is shown in FIG. 8. The substrate 202 is preferably formed of glass, silicon or a similar material that provides sufficient mechanical strength to support and reinforce the subsequent layers of the stacked assembly. For this reason, the substrate 202 may be thicker than the subsequent layers. The substrate layer 202 material may also be thinned or even removed during later process steps by etching or mechanically polishing when support is no longer needed. The substrate has a lower surface 205 and an upper surface 206 and extends to a leftward side 203 and rightward surface 204. Depicted in FIG. 9 are a plurality of relief cavities 208 and 208' created in the upper surface 206. These cavities 208 are aligned with the anticipated positions of saw lanes for severing the stacked packages. The cavities 208, 208' are created by mechanical cutting instruments as described above for the stacked assemblies 30 and 130. The relief cavities 208, 208' function as a stress relief to prevent fracture of the stacked assemblies due to notching of the substrate 202 during subsequent operations. Consequently, the cavities 208 are preferably formed with corner radii to alleviate stress concentrations. After forming the cavities 208, 208' an adhesive layer 209 is applied to the upper surface 206 and the cavities 208, 208' as shown in FIG. 10. Preferably the adhesive layer has a thickness over the upper surface 206 of 2.5-4.0 micrometers.

As shown in FIG. 11, to create a stacked assembly, the first subassembly 212 is positioned over the substrate layer 201. As depicted, the contacts 222, 222' and traces 224, 224' are aligned with the respective cavities 208, 208' and thus saw lanes 218 and 222. The active lower surface 214 and the traces 224 and 224' are applied to the adhesive layer 209 of the substrate layer 201 and the adhesive is cured. The subassembly 210, including the traces 224 and 224' are bonded to and supported by the substrate layer 201.

If desired, the upper surface 216 of the subassembly 210 may be thinned to create a new surface 216' and reduce the height of the subassembly as shown in FIG. 12. Preferably the reduced height of the subassembly is 22.4-25.4 micrometers if a compact stacked package is desired.

With reference to FIG. 13, next, a plurality of initial notches 240, 240' may be formed into the subassembly 210 to expose the traces 224, 224'. The notches 240, 240' are preferably formed using non-mechanical techniques such as selective chemical etching in order to preserve the delicate traces 240, 240'. The traces 240, 240' are adhered to and supported by the adhesive 209 of the substrate 201 during this step. The initial notches 240, 240' are aligned with the contacts 222, 222', the traces 224, 224' the cavities 208, 208' and saw lanes 218 and 222. The profile of the initial notches 40, 41 is configured to provide clearance for later notches as will be described.

After forming initial notches 240, 240', an adhesive layer 243 is applied to the upper surface 216 or 216' and the initial notches 40, 40', as shown in FIG. 14. Preferably the adhesive layer has a thickness over the upper surface 216 or 216' of approximately 2.5-4.0 micrometers.

Figure 16:
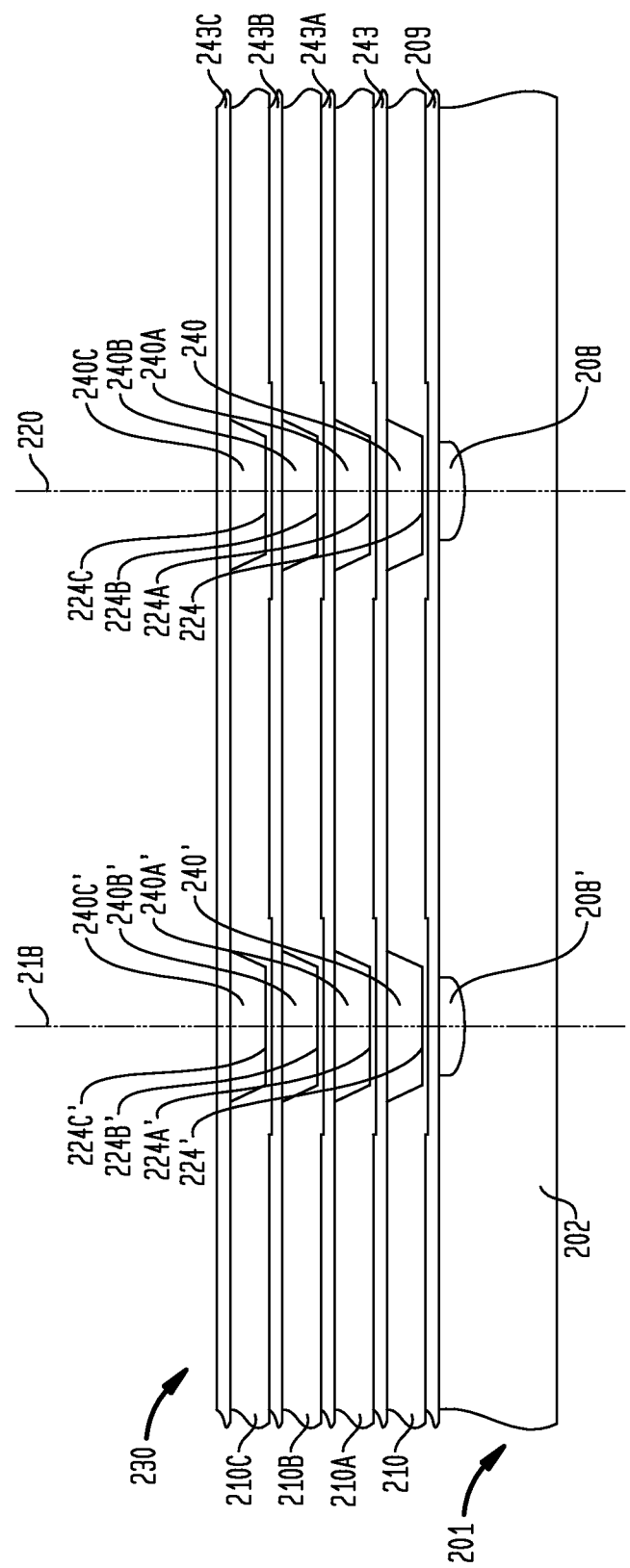
FIG. 16 is a cross-sectional view of the stacked assembly of FIG. 15 at a later stage during a method of manufacture according to one embodiment of the present invention.

As shown in FIGS. 15 and 16, second, third and fourth subassemblies, designated 210A, 210B and 210C respectively, are aligned with subassembly 210, stacked and laminated sequentially upward from subassembly 210 and substrate layer 201. The same sequence of steps earlier followed to laminate subassembly 210 to substrate 201 are used to laminate each of subassemblies 210A, 210B and 210C. The steps including alignment, lamination, curing, thinning, creation of initial notches and application of adhesive are followed sequentially for each step to create the stacked assembly 230. Thus microelectronic elements 212 of the first subassembly 210 are aligned with the microelectronic elements 212A of the second subassembly 210A, the microelectronic elements 212B of the third subassembly 210B, and the microelectronic elements 212C of the third subassembly 210C. Therefore, the initial notches 240, 240', 240A, 240A', 240B, 240B', 240C, 240C', are respectively aligned with the contacts 222, 222', 222A, 222A', 222B, 222B', 222C, 222C', the traces 224, 224', 224A, 224A', 224B, 224B', 224C, 224C', the cavities 208, 208' and the saw lanes 218 and 222. In summary, the stacked assembly 230 consists of a plurality of stacked and adhered microelectronic elements 12, 12A, 12B, 12C oriented and aligned in various rows and columns.

Figure 17:
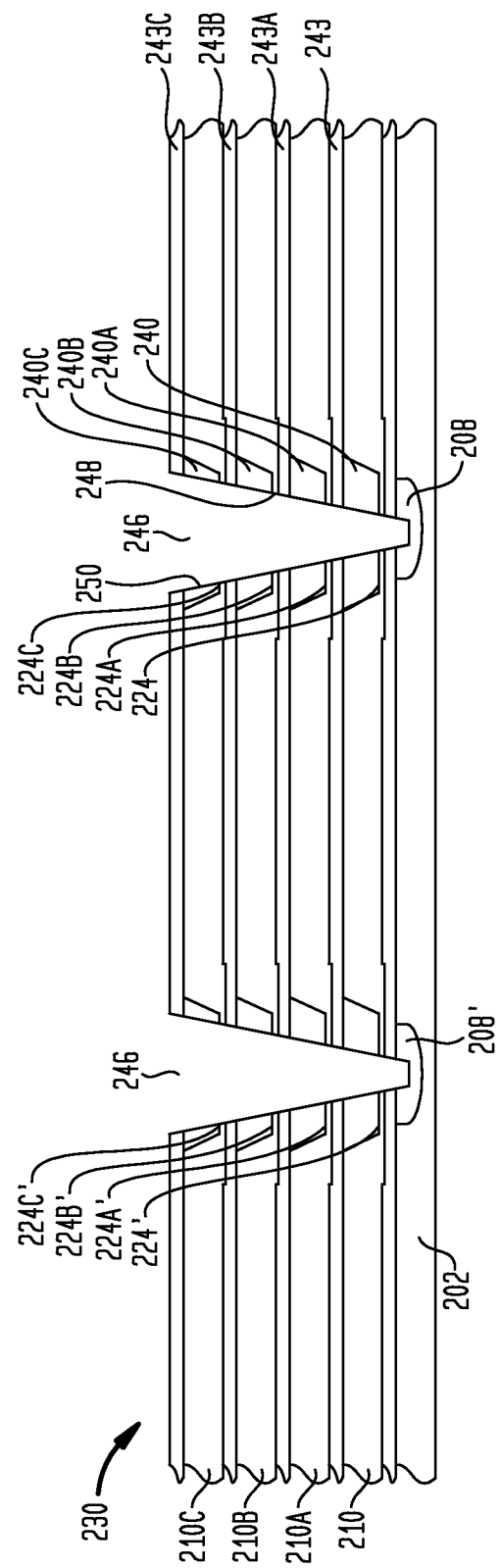
FIG. 17 is a cross-sectional view of the stacked assembly of FIG. 16 at a later stage during a method of manufacture according to one embodiment of the present invention.

The notches 246 are cut from the stacked assembly 230 at locations that are proximate the respective first edges 218, 218A, 218B, and 218C, second edges 220, 220A, 220B and 220C, third edges 219, 219A, 219B, 219C and fourth edges 221, 221A, 221B, 221C of the respective microelectronic elements 12, 12A, 12B, 12C of the various subassemblies 10, 10A, 10B, 10C. The notches 246, 247 are formed at the saw lanes 220, 218 by the methods described for the earlier embodiments. As seen in FIG. 17, one notable difference from the earlier embodiments is that the plurality of notches 246 are cut through the adhesive layers 243, 243A, 243B, 243C. Preferably, the notches 246 do not extend entirely through the stacked assembly 230 but rather extend only partially into the relief cavities 208, 208'. Thus the substrate 202 remains intact to connect the stacked microelectronic elements and is protected from cracking because the adhesive 209 rather that the substrate is cut. Although the notches 246 are illustrated having inclined side walls 248, 250, the side walls may also be straight.

The stacked assembly 230 of FIG. 17 includes four individual wafers/subassemblies stacked one upon another, but in alternate embodiments the stacked assembly 230 may include less or more wafers/subassemblies positioned on top of each other. Also shown in FIG. 17 is an optional thinning of the substrate 202 which may be accomplished by mechanical polishing or etching. This step may be performed between various steps in the process, preferably after formation of the notches 246.

Figure 18:
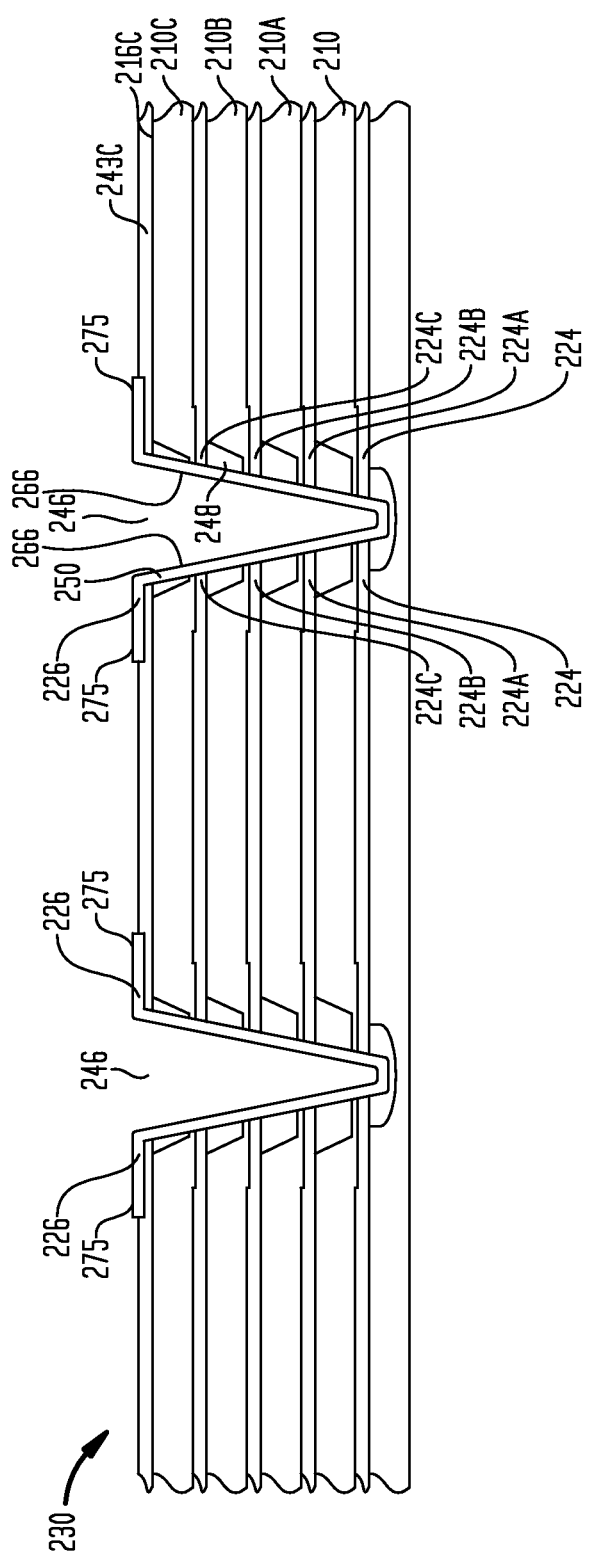
FIG. 18 is a cross-sectional view of the stacked assembly of FIG. 17 at a later stage during a method of manufacture according to one embodiment of the present invention.

Once the various notches 246 have been created in the stacked assembly 230, leads 266 may be formed on the inclined side walls 248, 250 of notches 246. The inclined side walls 248, 250 extend through at least part of the various first, second, third and fourth subassemblies 210, 210A, 210B, 210C that were created as a result of the notches 246, as shown in FIGS. 17 and 18. The leads 266 may be formed by any suitable metal deposition technique as described for the previous embodiments. The leads 266 extend within the various notches 246, and establish electrical contact with the traces 224, 224A, 224B and 224C.

Preferably the leads 266 extend past the inclined side walls 248, 250 of notches 246 and are adhered to the adhesive layer 243C on the upper surface 216C' of the third subassembly 210C. Therefore, the leads 266 include ends 275 remote from notches 246 and exposed on the surface of adhesive layer 243C.

Each lead 266 is in contact with four traces 224, 224A, 224B, 224C as a result of the traces being aligned and exposed at a respective inclined side walls 248 or 250. However, the leads 266 may be in electrical connection with less than four of the traces 224, 224A, 224B, 24C at a respective inclined side wall 48 or 50. Such an orientation may be as a result of the positioning of the traces 224, 224A, 224B, 224C in different planes that are into and out of the page as viewed by the reader as discussed for the previous embodiments.

Figure 19:
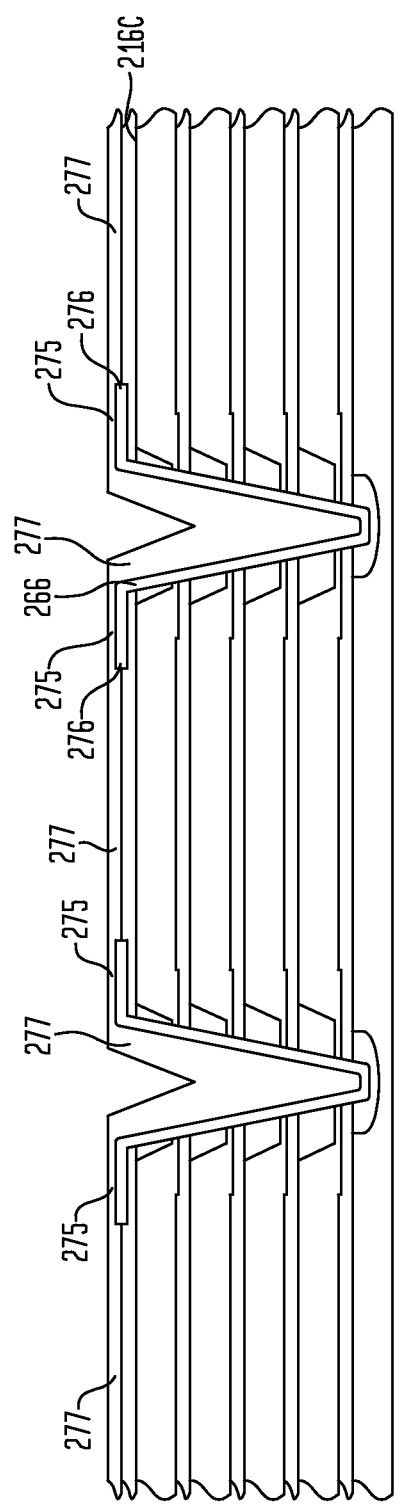
FIG. 19 is a cross-sectional view of the stacked assembly of FIG. 18 at a later stage during a method of manufacture according to one embodiment of the present invention.

Pads or solder bumps may be formed at the ends 275 of the leads 266. To that end, solder mask 277 may be patterned over the surface of adhesive layer 216C and leads 266 as shown in FIG. 19 for the attachment of wires or solder bumps.

Figure 20:
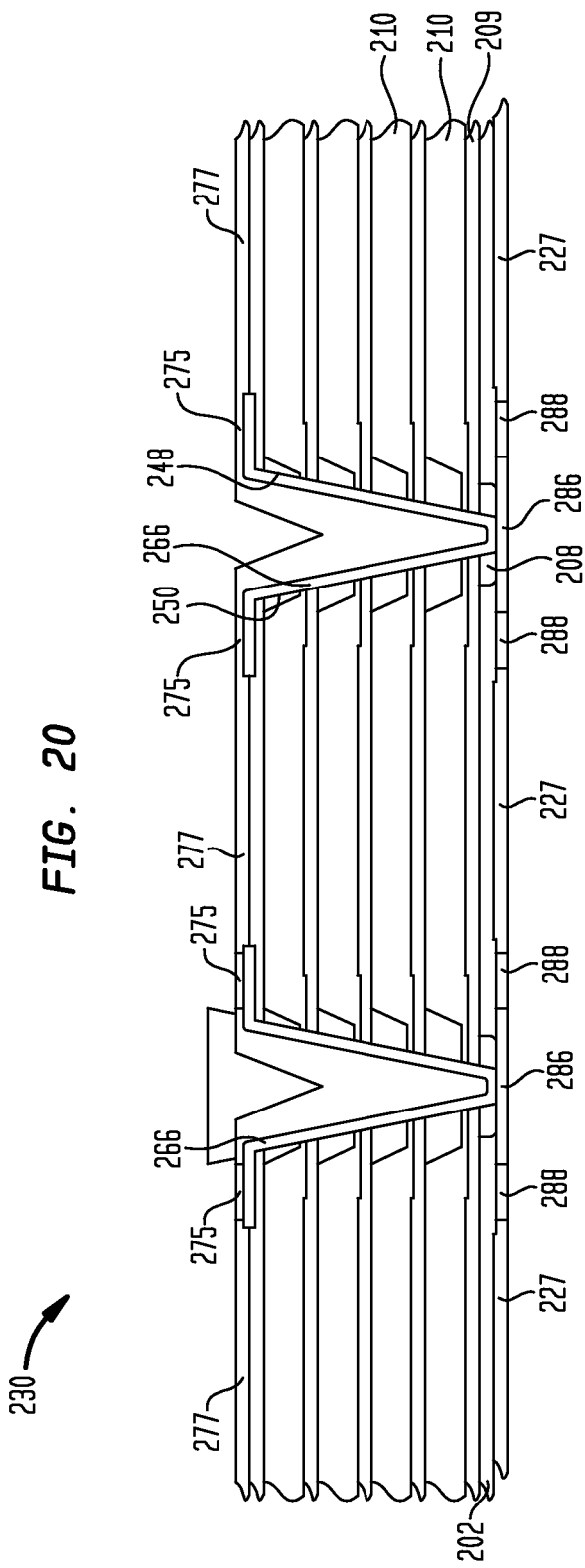
FIG. 20 is a cross-sectional view of an alternative embodiment of a stacked assembly based on the assembly shown in FIG. 19.

In another optional embodiment shown in FIG. 20, leads 266 may be extended to the bottom surface of the substrate 202. The leads 266 extend past the inclined side walls 248, 250 of notches 246 and enter the adhesive layer 209 within the relief cavity 208 positioned below the first subassembly 210. Upon further thinning of the substrate 202, the bottom of leads 266 are exposed and the leads may be extended by the methods previously discussed to create bottom leads 286. Solder mask 227 may be patterned over the bottom surface of substrate 202 for the attachment of wires or solder bumps to allow the formation of pads or bumps at the ends 288.

A particular advantage of this arrangement is that either stacked assemblies 230 or individual packages may in turn be stacked and electrically interconnected, one upon the other by aligning and connecting using, for instance solder bumps, the respective top ends 275 and bottom ends 288. In the example shown, the top ends 275 and bottom ends 288 to be connected are align in an appropriate pattern in the x-y plane to allow interconnection.

Because the leads 66 allow testing probes to access the elements, defective subassembly layers may be detected and isolated to allow sorting an rework. Wafer level rework is also facilitated by the ability to stack assemblies 230. Thus, for example, two stack assemblies 230 of the type shown in FIG. 20 and having two defective layers 210 each may be stacked and interconnected as a rework contingency. While having a greater overall thickness, elements from such stacked stack assemblies are functionally repaired to be equivalent to a non-defective stack assembly 230 and the value of the functioning layers 210 may be economically recovered by wafer level rework.

Figure 21:
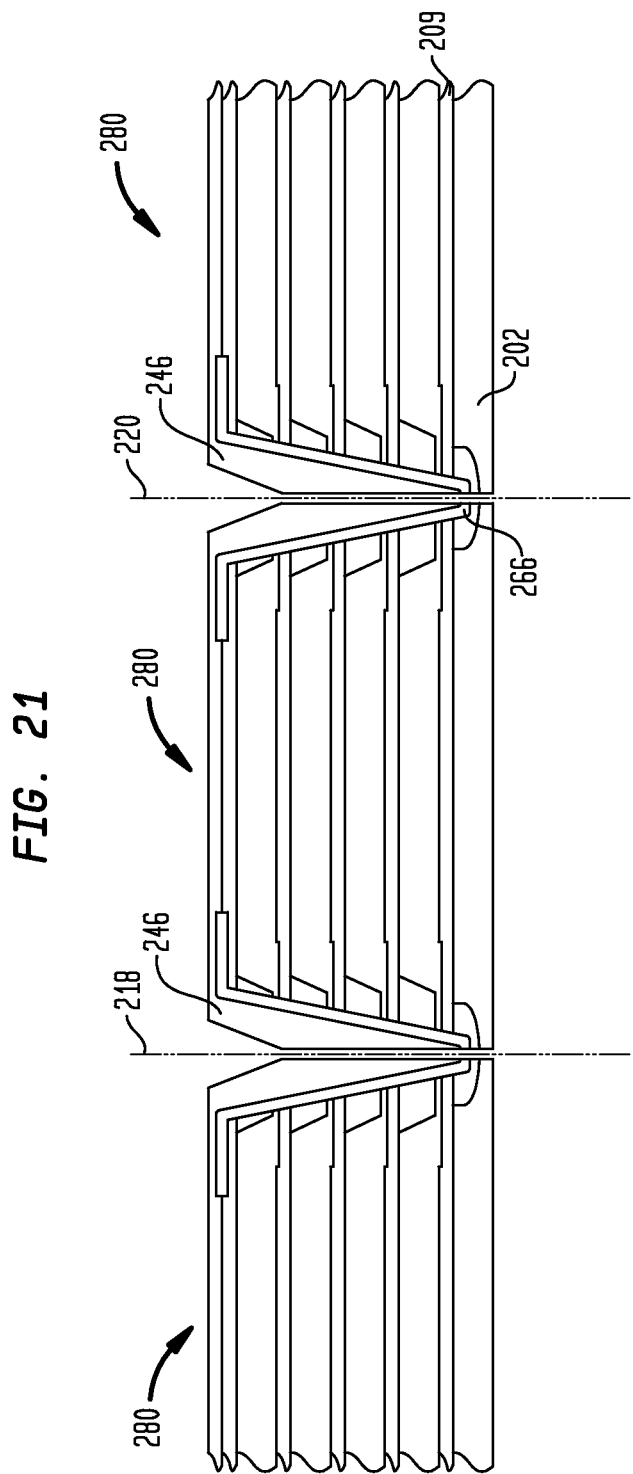
FIG. 21 is a cross-sectional view of the stacked assembly of FIG. 19 after the stacked assembly has been diced into individual units.
Figure 22:
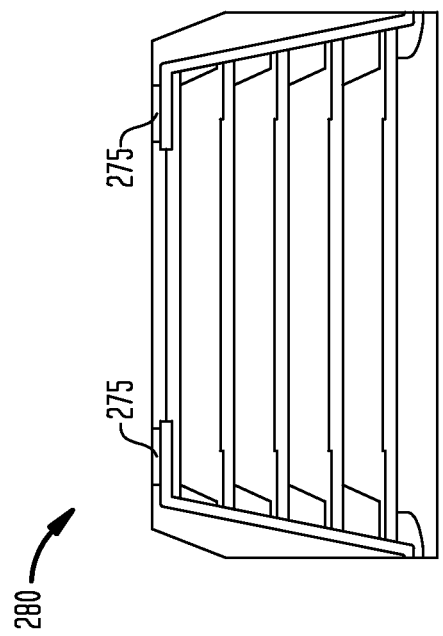
FIG. 22 is a cross-sectional view of an individual element created by the dicing process of FIG. 21 configured for wire bonding.

As shown in FIG. 21, after the notches 246 and various conductive elements including leads 266 are formed in the stacked assembly 230, individual packages 280 may be created by mechanically cutting through the leads 266, the adhesive 209 and the substrate 202, to sever the packages. The cut are aligned with dicing lanes 218 and 220 at locations that are proximate the notches 246 such that the notches 246 are allowed to extend entirely through the stacked assembly 230. Once the cuts have been performed, a plurality of stacked individual elements 280 are created, with each stacked individual unit 280 containing a plurality of microelectronic elements stacked one upon another. The stacked individual units 280 as shown in FIG. 22 may be electrically connected to a microelectronic element such as a substrate, circuit board or circuit panel via wire bonding or via pads 275 or the solder bumps 274, as shown in FIG. 23.

The embodiments described in FIGS. 7-23 result in thin elements 280 produced by wafer level packaging. Because the individual layers can be fabricated with thickness of approximately 25 micrometers, a total die package using a 30 micrometer substrate can be no less than 155 micrometers thick. As described, the substrate can be further thinned to reduce the package thickness to less than 125 micrometers.

Figure 24A:
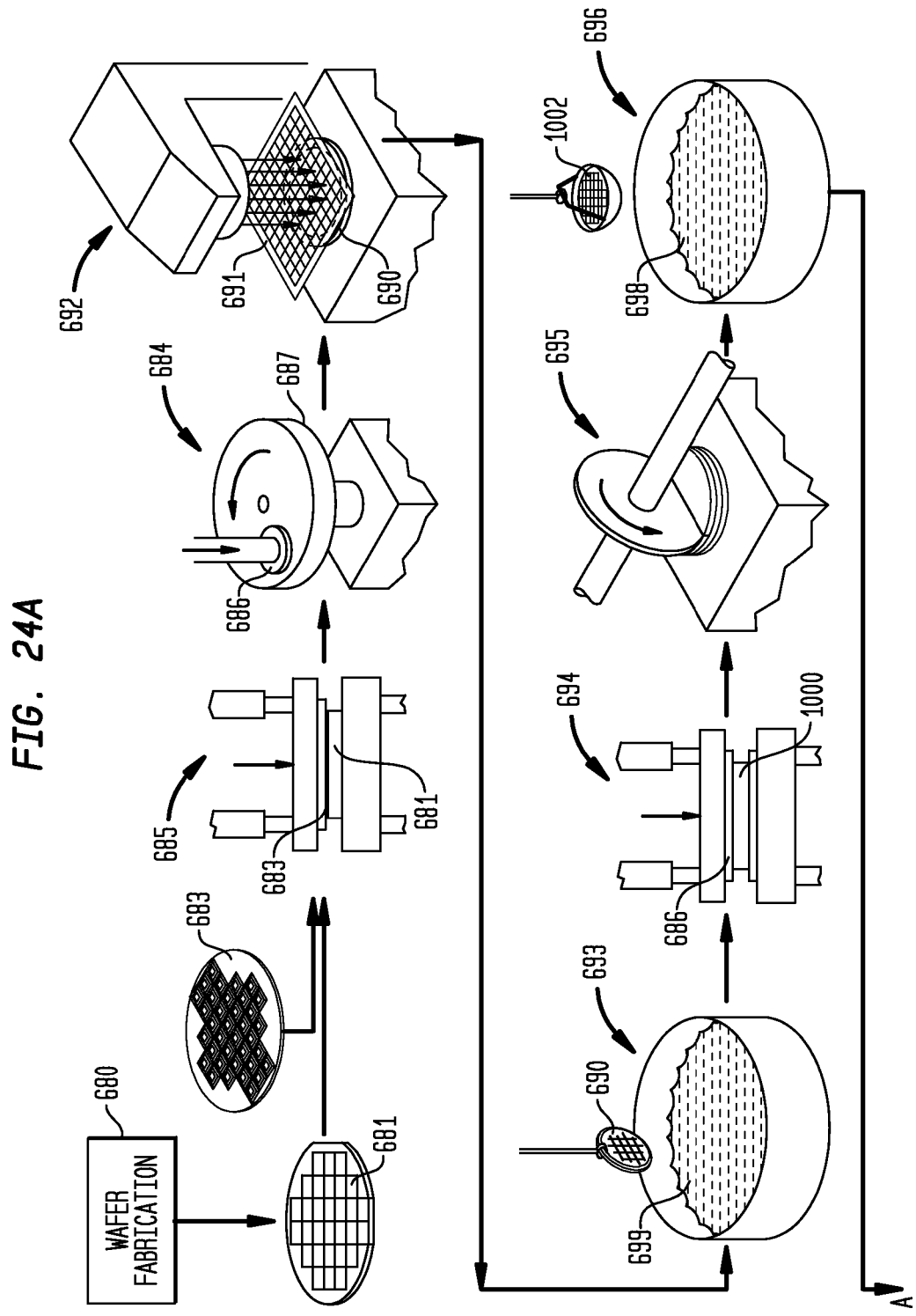
FIGS. 24A and 24B are illustrations of apparatus typically employed in the manufacture of stacked assemblies discussed herein.
Figure 24B:
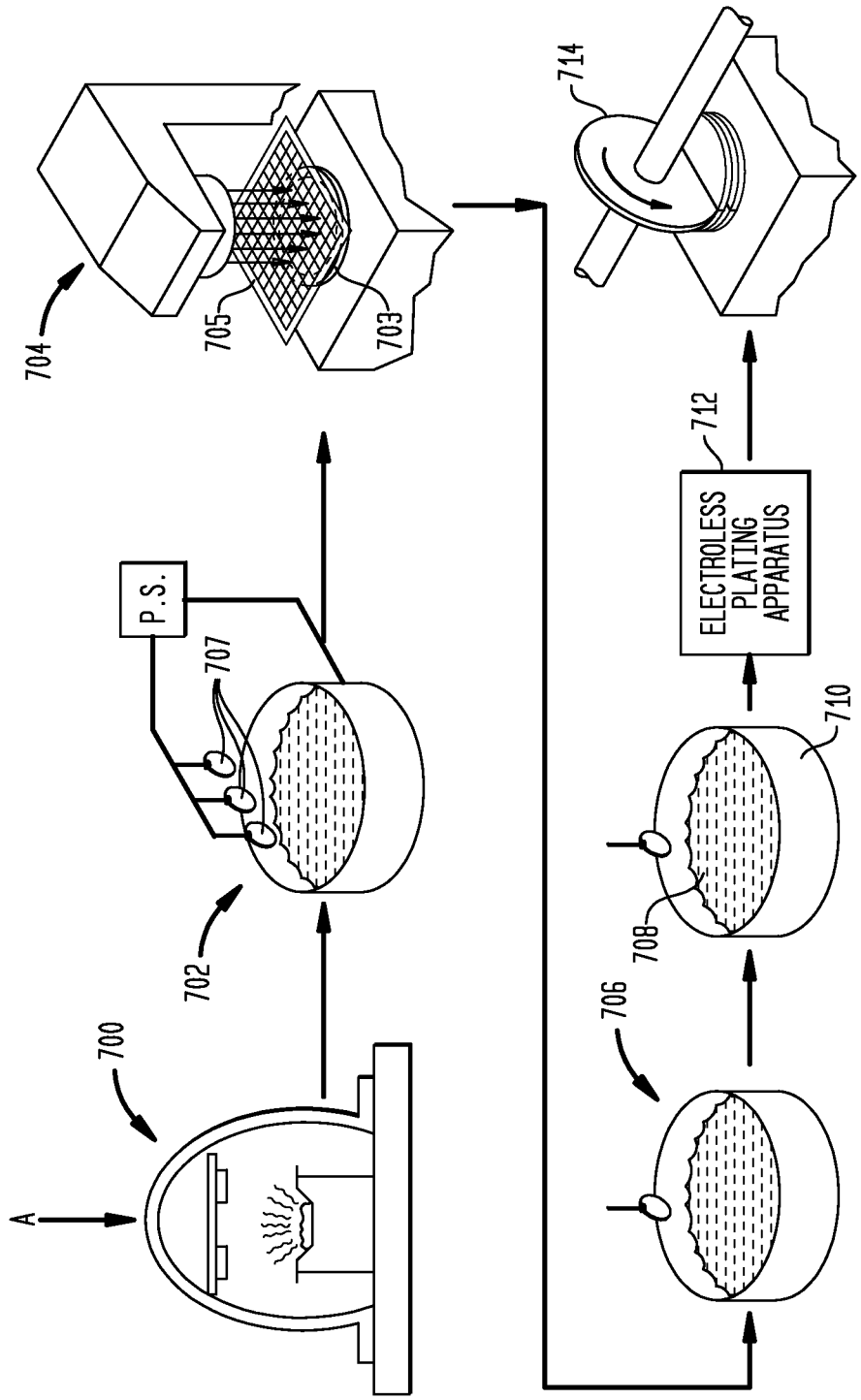

Reference is now made to FIGS. 24A and 24B, which are illustrations of apparatus employed in the manufacture of assemblies of the types discussed herein. As seen in FIGS. 24A and 24B, a conventional wafer fabrication facility 680 provides complete wafers 681, of the type partially shown in FIGS. 1A and 1B. Individual wafers 682 are bonded on their active surfaces to protective layers 683 by bonding apparatus 685, preferably having facilities for rotation of the wafer 682, the layer 683 and epoxy so as to obtain even distribution of the epoxy.

The bonded wafer 686 is thinned at its non-active surface as by grinding apparatus 684 using an abrasive 687. The wafer is then etched at its non-active surface, preferably by photolithography, such as by using conventional spin-coated photoresist, using a mask exposure machine 692 for the exposure of light sensitive photoresist 690 through the mask 691 and later etching the silicon in a bath 693 using solution 699. The etched wafer is bonded on the non-active side to protective layer 686 by bonding apparatus 694, which may be essentially the same as apparatus 685, to produce a doubly bonded wafer sandwich. The wafer may then by bonded to a second or more wafers.

Notching apparatus 695 partially cuts the bonded wafers. The notched wafers are then subjected to anti-corrosion treatment in a bath 696, containing a chromating solution 698.

Conductive layer deposition apparatus 700, which operates by vacuum deposition techniques, is employed to produce a conductive layer on one or more surfaces of each die of the wafers. The conductive layer deposition apparatus 700 may be employed prior to the two wafers being assembled together. Configuration of the contact strips or lead bridges is carried out preferably by using conventional electro-deposited photoresist 701. The photoresist 701 is applied to the stacked wafers 707 in a photoresist bath assembly 702. The photoresist 701 is preferably light configured by a UV exposure system 704, which may be identical to system 692, using a mask 705 to define suitable etching patterns. The photoresist is then developed in a development bath 706, and then the wafer is etched in a metal solution 708 located in an etching bath 710, thus providing a conductor configuration.

The exposed conductive strips are then plated, preferably by electroless plating apparatus 712. The stacked wafers is then diced into individual prepackaged integrated devices. Preferably the dicing blade 714 should be a diamond resinoid blade of thickness 4-12 mils, which corresponds to the thickness of the saw lanes.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of manufacturing a stacked package comprising the steps of:
   aligning saw lanes of a first wafer with saw lanes of a second wafer such that the saw lanes of the first wafer are positioned above the saw lanes of the second wafer, each of the first and second wafers having first and second microelectronic elements adjacent to and separated by a first saw lane of the saw lanes in a direction transverse to the first saw lane, each of the first and second microelectronic elements of each of the first and second wafers having at least a first trace extending therefrom towards the saw lanes;
   exposing at least the first traces of each of the first and second microelectronic elements of each of the first and second wafers by at least partially cutting through the aligned first saw lane of the first wafer and second wafer; and
   forming a lead in contact with at least the exposed first traces of each of the first and second microelectronic elements of each of the first and second wafers; and
   severing the first and second wafers to form first and second individual stacked packages, each of the first and second individual stacked packages including portions of each of the first and second wafers, such that a first portion of the lead is in contact with and in electrical communication with the first traces of each of the first and second wafers of the first individual stacked package and a second portion of the lead is in contact with and in electrical communication with the first traces of each of the first and second wafers of the second individual stacked package.

2. The method of claim 1, wherein the first and second wafers include a plurality of microelectronic elements in electrical contact with the plurality of traces.

3. The method of claim 2, further comprising attaching the first wafer to the second wafer after the saw lanes of the two wafers are aligned.

4. The method of claim 2, wherein the leads include first ends that extend to a front face of one of the wafers.

5. The method of claim 4, further comprising providing solder bumps at the first ends of the leads for attaching to an additional microelectronic device.

6. The method of claim 1, further comprising aligning the saw lanes of at least one additional wafer with the saw lanes of the first and second wafers, wherein during the step of exposing the plurality of traces of the first and second wafer a plurality of traces of the at least one additional wafer is also exposed.

7. A method of making a stacked microelectronic package, the method comprising the steps of:
   forming a microelectronic assembly by stacking a first subassembly having saw lanes and including a plurality of microelectronic elements onto a substrate having saw lanes such that the saw lanes of the first subassembly are aligned with the saw lanes of the substrate, stacking a second subassembly having saw lanes and including a plurality of microelectronic elements above said first subassembly such that the saw lanes of the second subassembly are aligned with the saw lanes of the first subassembly, at least some of the plurality of microelectronic elements of said first subassembly and said second subassembly having traces that extend to respective edges of the microelectronic elements;
   forming notches in the microelectronic assembly at the saw lanes of the respective subassemblies so as to expose the traces of at least some of the plurality of microelectronic elements; and
   forming leads at the side walls of the notches, the leads being in electrical communication with at least some of the traces.

8. The method of claim 7, wherein a relief channel, aligned with the saw lanes of the substrate, extends partially through the substrate.

9. The method of claim 7, wherein the leads include first ends that extend to an upper face of the second subassembly.

10. The method of claim 9, wherein the leads include second ends that extend to an upper face of the substrates.

11. The method of claim 8, wherein the forming of notches does not include forming notches in the substrate.

12. The method of claim 7, further comprising dicing through the saw lanes of the substrate to form individual stacked packages.

13. The method of claim 7, wherein during the forming of the microelectronic assembly, a first face of the first subassembly is adhered to a second face of the substrate by an adhesive.

14. The method of claim 7, wherein at least some of the plurality of microelectronic elements of said first subassembly and said second subassembly have traces that extend across said saw lanes of said first subassembly and said second subassembly.

15. The method of claim 7, wherein the forming of notches includes forming initial notches in at least said first subassembly so as to expose said traces and filling said initial notches with adhesive so as to cover said traces, forming initial notches in at least said second subassembly so as to expose said traces and filling said initial notches with adhesive so as to cover said traces, and forming said notches in said adhesive so as to expose the traces of at least some of the plurality of microelectronic elements.

* * * * *